United States Patent
Wu et al.

(10) Patent No.: US 12,170,267 B2
(45) Date of Patent: Dec. 17, 2024

(54) SEMICONDUCTOR DEVICE AND METHOD OF MANUFACTURE

(71) Applicant: Taiwan Semiconductor Manufacturing Co., Ltd., Hsinchu (TW)

(72) Inventors: Jiun Yi Wu, Zhongli (TW); Chen-Hua Yu, Hsinchu (TW); Chung-Shi Liu, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/300,175

(22) Filed: Apr. 13, 2023

(65) Prior Publication Data

US 2023/0253368 A1   Aug. 10, 2023

Related U.S. Application Data

(62) Division of application No. 17/143,657, filed on Jan. 7, 2021, now Pat. No. 11,664,350.

(60) Provisional application No. 63/027,609, filed on May 20, 2020.

(51) Int. Cl.
| | |
|---|---|
| *H01L 21/00* | (2006.01) |
| *H01L 21/56* | (2006.01) |
| *H01L 23/00* | (2006.01) |
| *H01L 23/52* | (2006.01) |
| *H01L 23/538* | (2006.01) |
| *H01L 25/065* | (2023.01) |

(52) U.S. Cl.
CPC .......... *H01L 25/0657* (2013.01); *H01L 21/56* (2013.01); *H01L 23/5384* (2013.01); *H01L 23/5385* (2013.01); *H01L 23/5386* (2013.01); *H01L 24/14* (2013.01); *H01L 24/95* (2013.01)

(58) Field of Classification Search
CPC . H01L 25/0657; H01L 21/56; H01L 23/5384; H01L 23/5385; H01L 23/5386; H01L 24/14; H01L 24/95
See application file for complete search history.

(56) References Cited

U.S. PATENT DOCUMENTS

| | | | |
|---|---|---|---|
| 7,005,316 B2 | 2/2006 | Lee et al. | |
| 8,993,380 B2 | 3/2015 | Hou et al. | |
| 9,209,146 B2 | 12/2015 | Kim et al. | |
| 9,281,254 B2 | 3/2016 | Yu et al. | |

(Continued)

FOREIGN PATENT DOCUMENTS

| | | |
|---|---|---|
| CN | 109904134 A | 6/2019 |
| CN | 110060935 A | 7/2019 |

(Continued)

*Primary Examiner* — Nicholas J Tobergte
(74) *Attorney, Agent, or Firm* — Slater Matsil, LLP

(57) ABSTRACT

A structure includes core substrates attached to a first side of a redistribution structure, wherein the redistribution structure includes first conductive features and first dielectric layers, wherein each core substrate includes conductive pillars, wherein the conductive pillars of the core substrates physically and electrically contact first conductive features; an encapsulant extending over the first side of the redistribution structure, wherein the encapsulant extends along sidewalls of each core substrate; and an integrated device package connected to a second side of the redistribution structure.

20 Claims, 21 Drawing Sheets

(56) References Cited

U.S. PATENT DOCUMENTS

| | | | |
|---|---|---|---|
| 9,299,649 B2 | 3/2016 | Chiu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 10,854,552 B2 | 12/2020 | Wu et al. | |
| 11,482,484 B2* | 10/2022 | Wu | H01L 23/49816 |
| 2011/0068459 A1 | 3/2011 | Pagaila et al. | |
| 2014/0042643 A1 | 2/2014 | Yu et al. | |
| 2016/0148903 A1* | 5/2016 | Su | H01L 21/486 |
| | | | 257/737 |
| 2018/0005984 A1 | 1/2018 | Yu et al. | |
| 2018/0226349 A1* | 8/2018 | Yu | H01L 21/568 |
| 2019/0139924 A1* | 5/2019 | Chen | H01L 25/0753 |
| 2019/0148250 A1* | 5/2019 | Yu | H01L 21/56 |
| | | | 257/773 |
| 2019/0229046 A1 | 7/2019 | Tsai et al. | |
| 2019/0318984 A1 | 10/2019 | Kim et al. | |
| 2019/0326223 A1 | 10/2019 | Lee et al. | |
| 2019/0341368 A1 | 11/2019 | Hu et al. | |
| 2020/0006241 A1 | 1/2020 | Wu et al. | |
| 2020/0058627 A1* | 2/2020 | Chen | H01L 21/56 |
| 2020/0135708 A1 | 4/2020 | Chen et al. | |
| 2020/0312770 A1 | 10/2020 | Lu et al. | |
| 2020/0312826 A1 | 10/2020 | Jung et al. | |
| 2021/0202389 A1 | 7/2021 | Hsieh et al. | |
| 2021/0242117 A1* | 8/2021 | Hung | H01L 21/6835 |
| 2021/0366814 A1 | 11/2021 | Hou et al. | |
| 2022/0285317 A1* | 9/2022 | Yu | H01L 21/6835 |
| 2022/0336337 A1* | 10/2022 | Hung | H01L 21/561 |

FOREIGN PATENT DOCUMENTS

| | | |
|---|---|---|
| CN | 110660675 A | 1/2020 |
| KR | 20130139600 A | 12/2013 |
| KR | 20200002630 A | 1/2020 |
| KR | 20200027419 A | 3/2020 |
| TW | 202017131 A | 5/2020 |

* cited by examiner

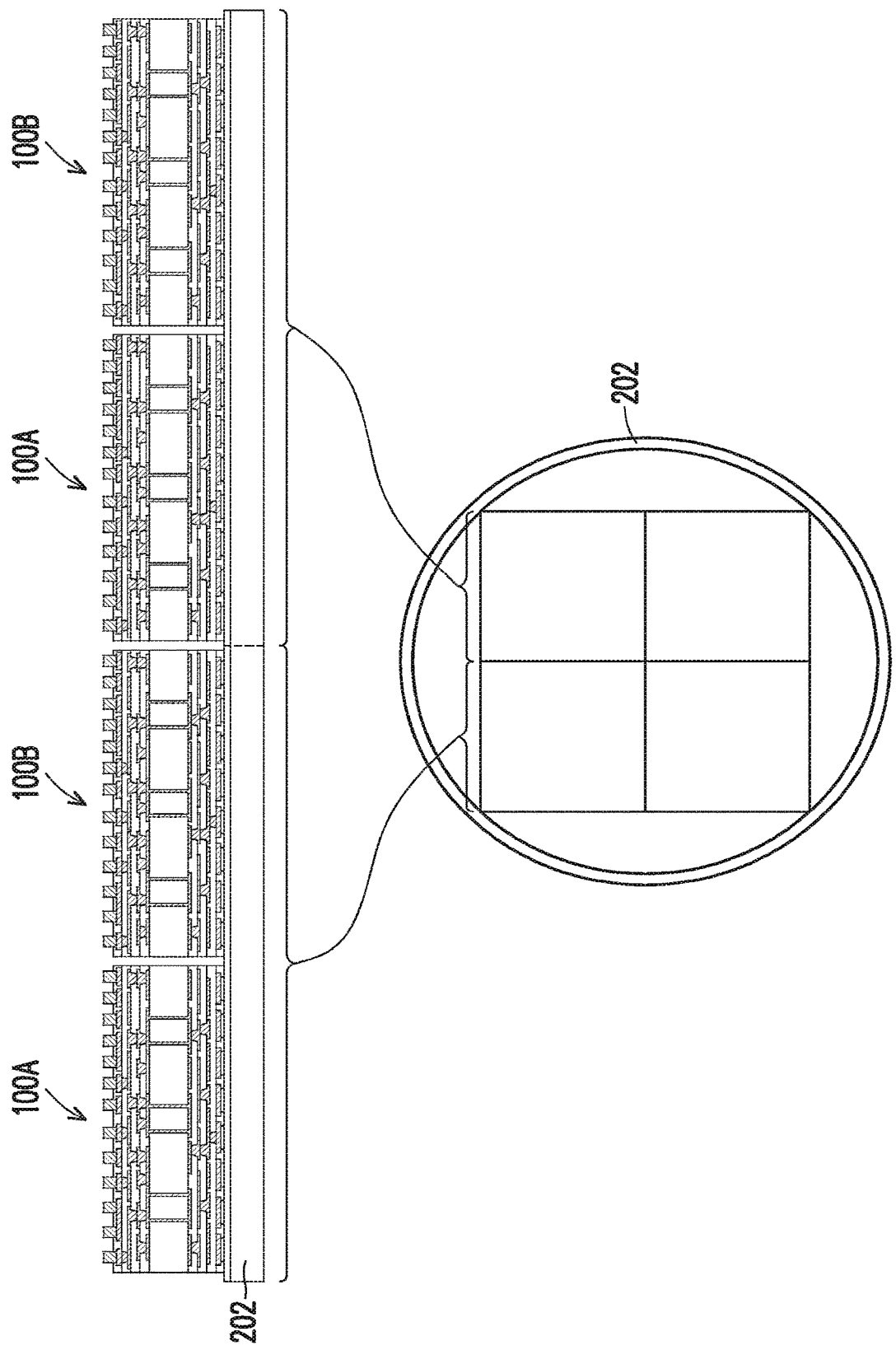

SEMICONDUCTOR DEVICE AND METHOD OF MANUFACTURE

PRIORITY CLAIM AND CROSS-REFERENCE

This application is a divisional of U.S. patent application Ser. No. 17/143,657, filed on Jan. 7, 2021, entitled "Semiconductor Device and Method of Manufacture," which claims the benefits of U.S. Provisional Application No. 63/027,609, filed on May 20, 2020, which applications are hereby incorporated herein by reference.

BACKGROUND

The semiconductor industry continues to improve the integration density of various electronic components (e.g., transistors, diodes, resistors, capacitors, etc.) by continual reductions in minimum feature size, which allow more components, hence more functions, to be integrated into a given area. Integrated circuits with high functionality require many input/output pads. Yet, small packages may be desired for applications where miniaturization is important.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A, 2B, and 2C illustrate cross-sectional views and plan views of intermediate steps of forming structures on carrier substrates, in accordance with some embodiments.

DETAILED DESCRIPTION

Figure 1:
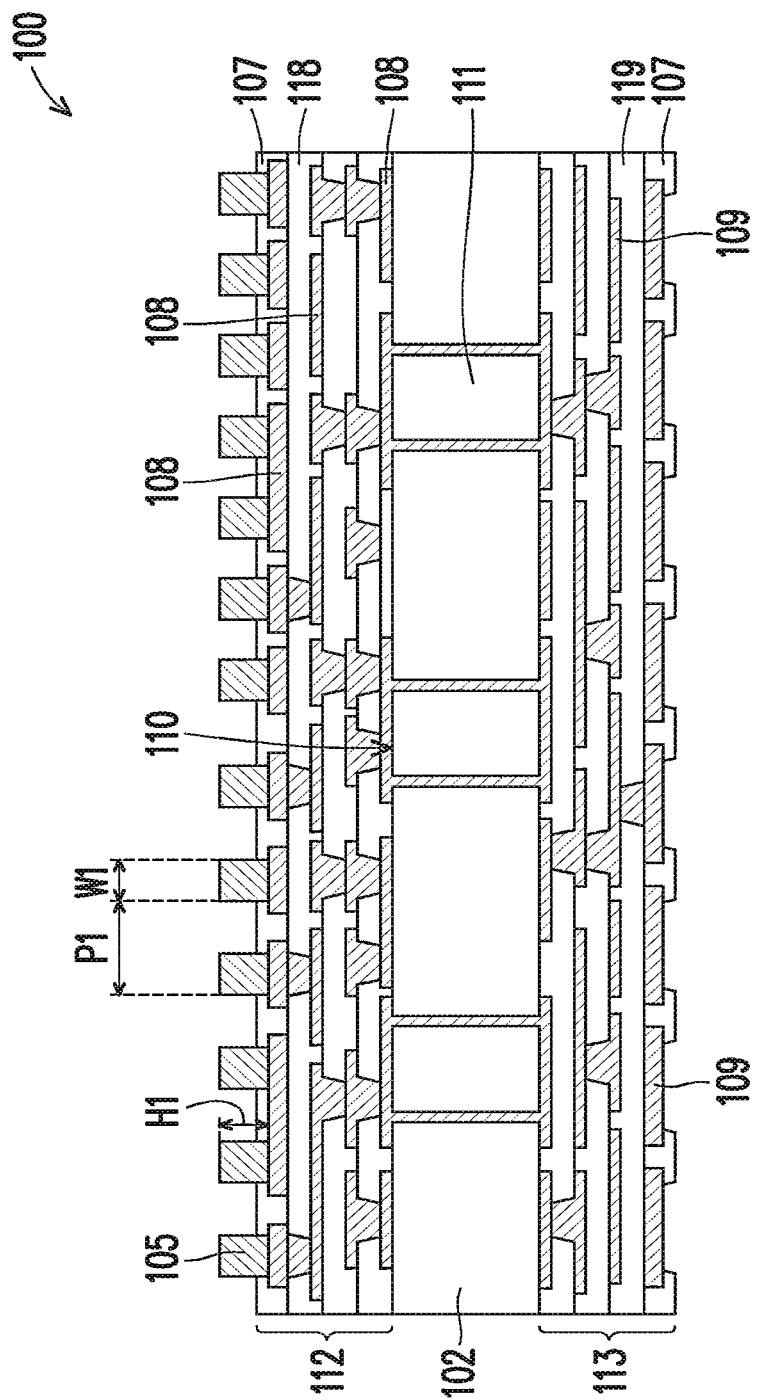
FIG. 1 illustrates a cross-sectional view of an interconnect structure, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure, various aspects of a package structure and the formation thereof are described. The techniques described herein allow for the formation of a package structure having multiple interconnect structures with reduced warping, which can improve the joints that bond devices (e.g., integrated circuit packages) to components of the package structure. The techniques described herein can reduce warping or cracking, particularly when multiple interconnects or integrated circuit dies are attached to the redistribution structure. Reducing stress within the package in this manner can improve performance and yield. One or more redistribution structures may be formed over multiple interconnect structures and electrically connected to the interconnect structures by conductive pillars of the interconnect structures. This can allow for improved planarity of the redistribution structure. A second redistribution structure may be formed that includes fine line conductive features, which can allow for improved device performance. Additionally, techniques described herein can reduce the cost or processing time of a package structure.

FIG. 1 illustrates an example interconnect structure 100, in accordance with some embodiments. One or more interconnect structures 100 may be incorporated within a package structure 200 (see FIG. 9) to provide electrical routing and structural stability for the package structure 200. In some embodiments, the interconnect structure 100 may be, for example, an interposer or a "semi-finished substrate," and may be free of active devices. The interconnect structure 100 may have a thickness between about 200 μm and about 3000 μm, though other thicknesses are possible.

In some embodiments, interconnect structure 100 may include routing layers (e.g., routing structures 112 and 113) formed on a core substrate 102. The core substrate 102 may include a material such as Ajinomoto build-up film (ABF), a pre-impregnated composite fiber ("prepreg") material, an epoxy, a molding compound, an epoxy molding compound, fiberglass-reinforced resin materials, printed circuit board (PCB) materials, silica filler, polymer materials, polyimide materials, paper, glass fiber, non-woven glass fabric, glass, ceramic, other laminates, the like, or combinations thereof. In some embodiments, the core substrate may be a doublesided copper-clad laminate (CCL) substrate or the like. The core substrate 102 may have a thickness between about 30 µm and about 2000 µm, though other thicknesses are possible.

The interconnect structure 100 may have one or more routing structures 112/113 formed on each side of the core substrate 102 and through vias 110 extending through the core substrate 102. The routing structures 112/113 and through vias 110 provide electrical routing and interconnection. The through vias 110 may, for example, interconnect the routing structure 112 and the routing structure 113. The routing structures 112/113 may each include one or more routing layers 108/109 and one or more dielectric layers 118/119. In some embodiments, the routing layers 108/109 and/or through vias 110 may comprise one or more layers of copper, nickel, aluminum, other conductive materials, the like, or a combination thereof. In some embodiments, the dielectric layers 118/119 may include materials such as a build-up material, ABF, a prepreg material, a laminate material, another material similar to those described above for the core substrate 102, the like, or combinations thereof. In other embodiments, an interconnect structure 100 may include only one routing structure (e.g. 112 or 113) or the routing structures 112/113 may each include more or fewer routing layers. Each routing layer of the routing structures 112/113 may have a thickness between about 5 µm and about 50 µm, and the routing structures 112/113 may each have a total thickness between about 2 µm and about 50 µm, though other thicknesses are possible.

In some embodiments, the openings in the core substrate 102 for the through vias 110 may be filled with a filler material 111. The filler material 111 may provide structural support and protection for the conductive material of the through vias 110. In some embodiments, the filler material 111 may be a material such as a molding material, epoxy, an epoxy molding compound, a resin, materials including monomers or oligomers, such as acrylated urethanes, rubber-modified acrylated epoxy resins, or multifunctional monomers, the like, or a combination thereof. In some embodiments, the filler material 111 may include pigments or dyes (e.g., for color), or other fillers and additives that modify rheology, improve adhesion, or affect other properties of the filler material 111. In some embodiments, the conductive material of the through vias 110 may completely fill the through vias 110, omitting the filler material 111.

In some embodiments, the interconnect structure 100 may include a passivation layer 107 formed over one or more sides of the interconnect structure 100. The passivation layer 107 may be a material such as a nitride, an oxide, a polyimide, a low-temp polyimide, a solder resist, combinations thereof, or the like. Once formed, the passivation layer 107 may be patterned (e.g., using a suitable photolithographic and etching process) to expose portions of the routing layers 108/109 of the routing structures 112/113. Conductive pillars 105 may be formed on the portions of a routing layer exposed by the openings.

In some embodiments, conductive pillars 105 are formed on one or both routing structure 112/113 of the interconnect structure 100. For example, FIG. 1 shows conductive pillars 105 formed on the outermost routing layer 108 of the routing structure 112. The conductive pillars 105 provide electrical connection between the routing structure 112 and a subsequently formed redistribution structure 208 (see FIG. 7). In some embodiments, the conductive pillars 105 comprise metal posts or metal pillars formed in the openings in the passivation layer 107 that expose portions of a routing layer (e.g., 108 or 109) of a routing structure (e.g., 112 or 113).

The conductive pillars 105 may be formed by a suitable process such as sputtering, printing, electroplating, electroless plating, CVD, or the like. The conductive pillars 105 may comprise one or more conductive materials such as copper, titanium, tungsten, aluminum, another metal, an alloy, the like, or combinations thereof. The conductive pillars 105 may be solder-free. The conductive pillars 105 may be formed having substantially vertical sidewalls or having tapered sidewalls.

As an example to form the conductive pillars 105, a seed layer (not shown) is formed over the passivation layer 107 and portions of the routing layer 108/109 exposed by the openings in the passivation layer 107. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to the conductive pillars 105. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the conductive pillars 105.

In some embodiments, the conductive pillars 105 include a metal cap layer formed on the top of the metal pillars. The metal cap layer may include nickel, tin, tin-lead, gold, silver, palladium, indium, nickel-palladium-gold, nickel-gold, the like, or a combination thereof and may be formed by a plating process. The conductive pillars 105 may be subsequently planarized (see FIG. 4). The use of conductive pillars 105 as described herein can improve planarity of the subsequently formed redistribution structure 208 (see FIG. 7) and reduce warping, which can reduce the chance of joint failure or delamination within a package structure (e.g., package structure 200, shown in FIG. 9, or the like). In addition, the planarization process can be used to reduce the effect of variance in the thicknesses of the interconnect structures 100.

In some embodiments, the conductive pillars 105 may be formed having a height H1 that is in the range of about 10 µm to about 500 µm, though other heights are possible. After planarization (see FIG. 4), the heights of the conductive pillars 105 may be reduced. In some embodiments, the conductive pillars 105 may be formed having a width W1 that is in the range of about 20 µm to about 800 µm, though other widths are possible. In some cases, conductive pillars having a larger width may provide a better electrical contact to an overlying redistribution structure (e.g., redistribution structure 208). In some embodiments, the conductive pillars 105 may be formed having a pitch P1 that is in the range of about 50 µm to about 1,000 µm, though other pitches are possible.

Figure 8:
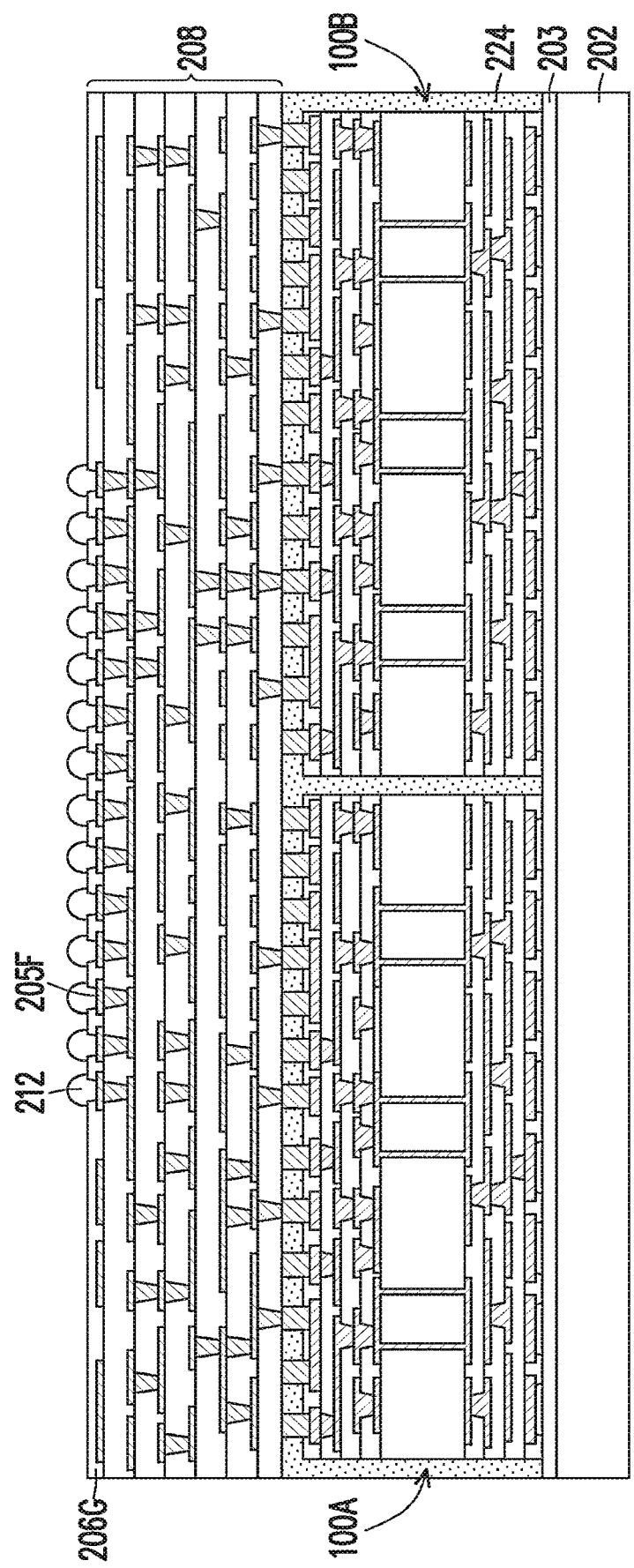
Figure 9:
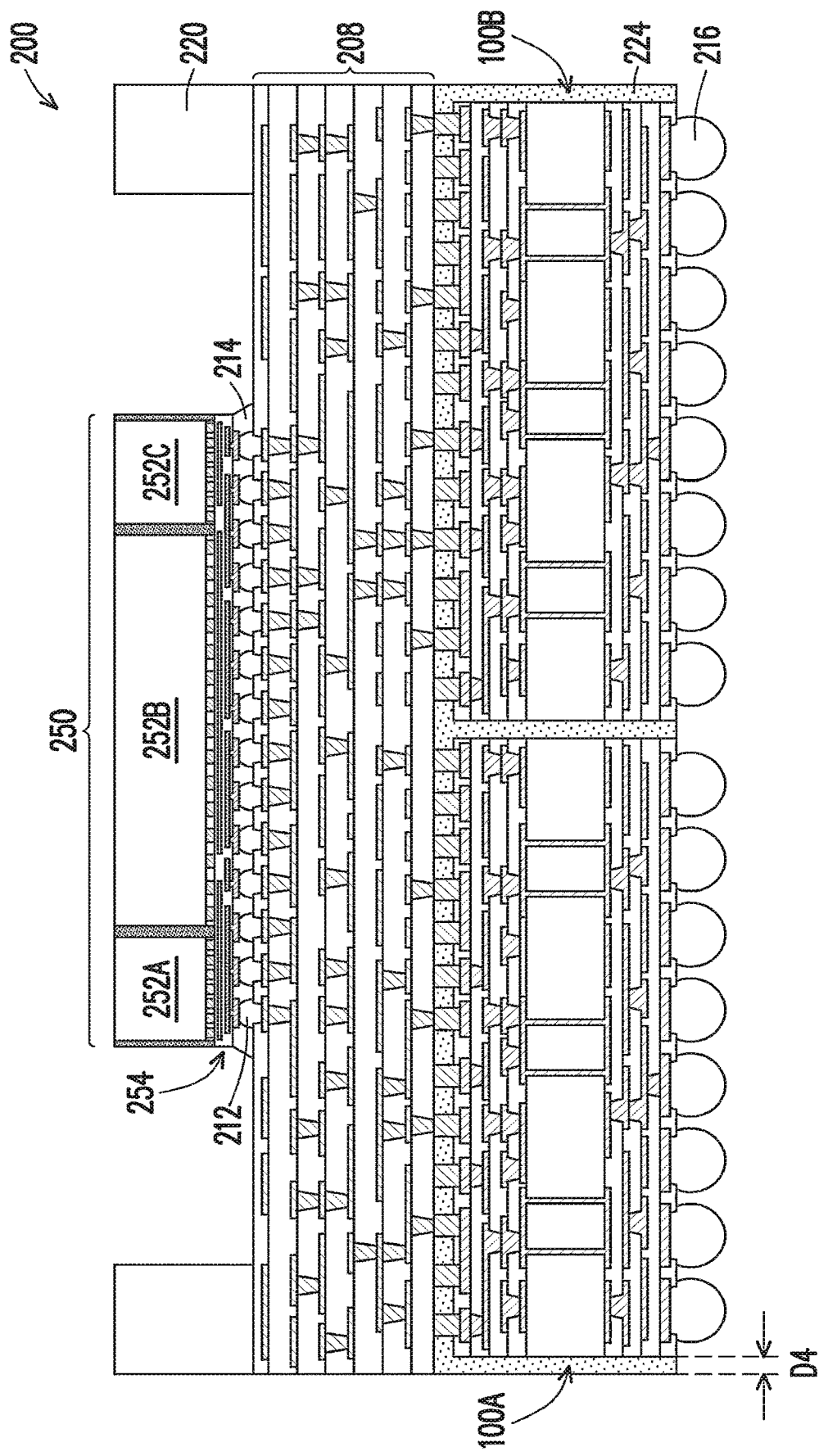
Figure 10:
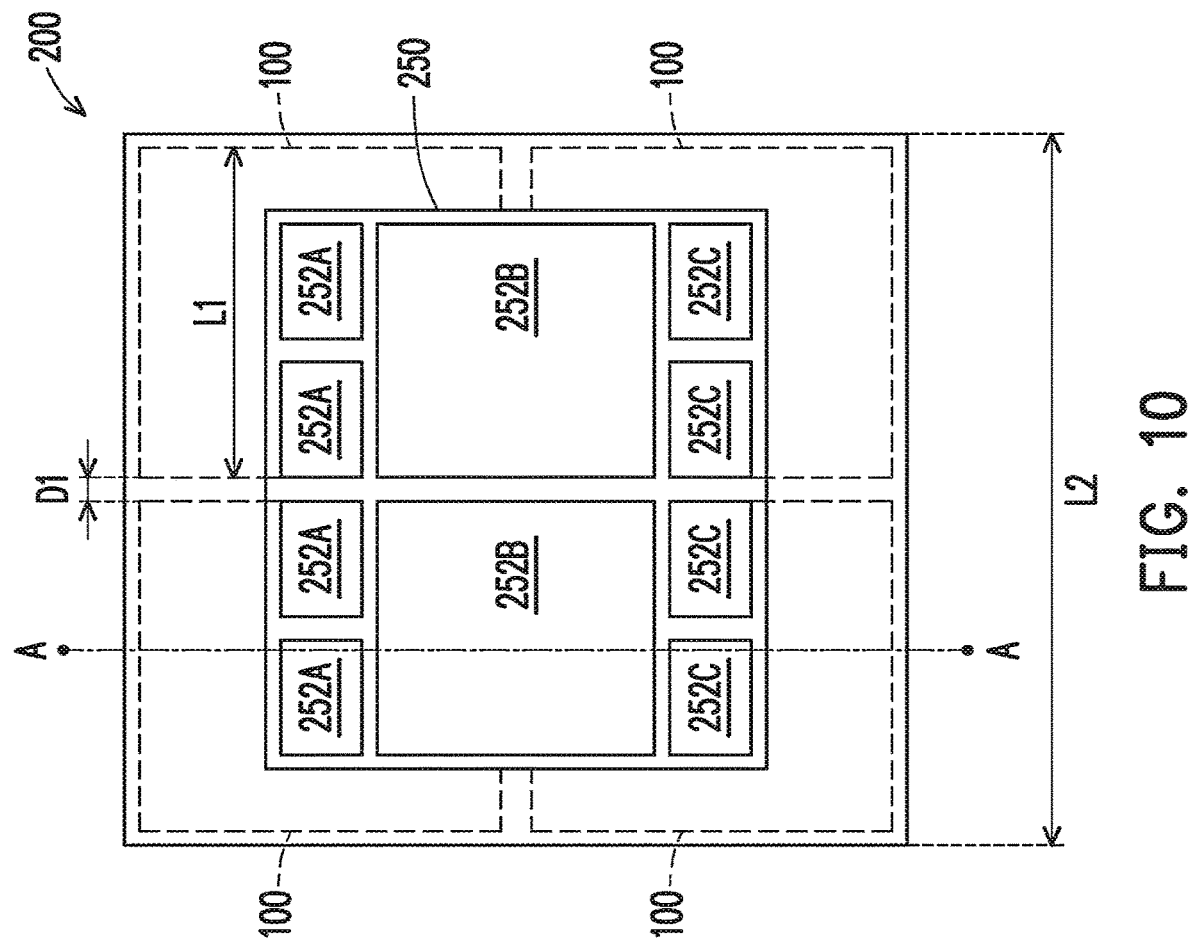
FIG. 10 illustrates a plan view of an intermediate step of forming a package structure, in accordance with some embodiments.

FIGS. 2A through 10 illustrate intermediate steps in the formation of a package structure 200 (see FIG. 10), in accordance with some embodiments. FIG. 10 illustrates a schematic plan view of the package structure 200, and FIGS. 3 through 9 illustrate cross-sectional views through the reference cross-section A-A shown in FIG. 10. The package structure 200 includes a redistribution structure 208 formed over multiple interconnect structures 100, which are indicated as interconnect structures 100A and 100B. The interconnect structures 100A-B may be similar to the interconnect structure 100 shown in FIG. 1, and the interconnect structures 100A and 100B may be different from each other. The number, arrangement, or dimensions of the interconnect structures within a package structure may be different than shown.

FIGS. 2A through 7 illustrate the formation of a redistribution structure 208, which includes multiple conductive lines 205A-F, multiple dielectric layers 206A-G, and multiple conductive vias 207A-F. The redistribution structure 208 is shown as an illustrative example, and more or fewer conductive lines, dielectric layers, and/or conductive vias may be used in other embodiments. The redistribution structure 208 may be formed using different materials and/or techniques than described below.

Figure 2A:
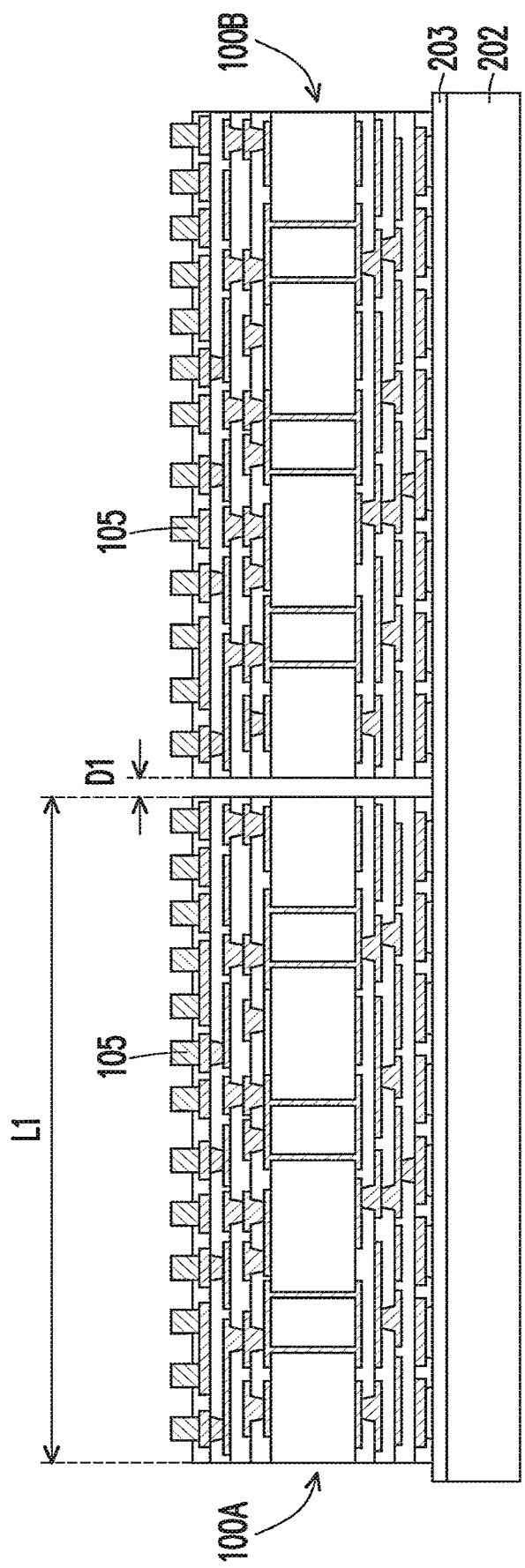

Turning to FIG. 2A, the interconnect structures 100A-B are attached to a carrier substrate 202, in accordance with some embodiments. In some embodiments, the interconnect structures 100 may be attached to a release layer 203 or the like that is formed on the carrier substrate 202. In some embodiments, the interconnect structures 100 attached to the carrier substrate 202 may have a length L1 that is in the range of about 15 mm to about 500 mm, though other lengths are possible. In some embodiments, adjacent interconnect structures 100 may be separated by a lateral distance D1 that is in the range of about 40 µm to about 5000 µm, though other separation distances are possible.

Figure 2C:
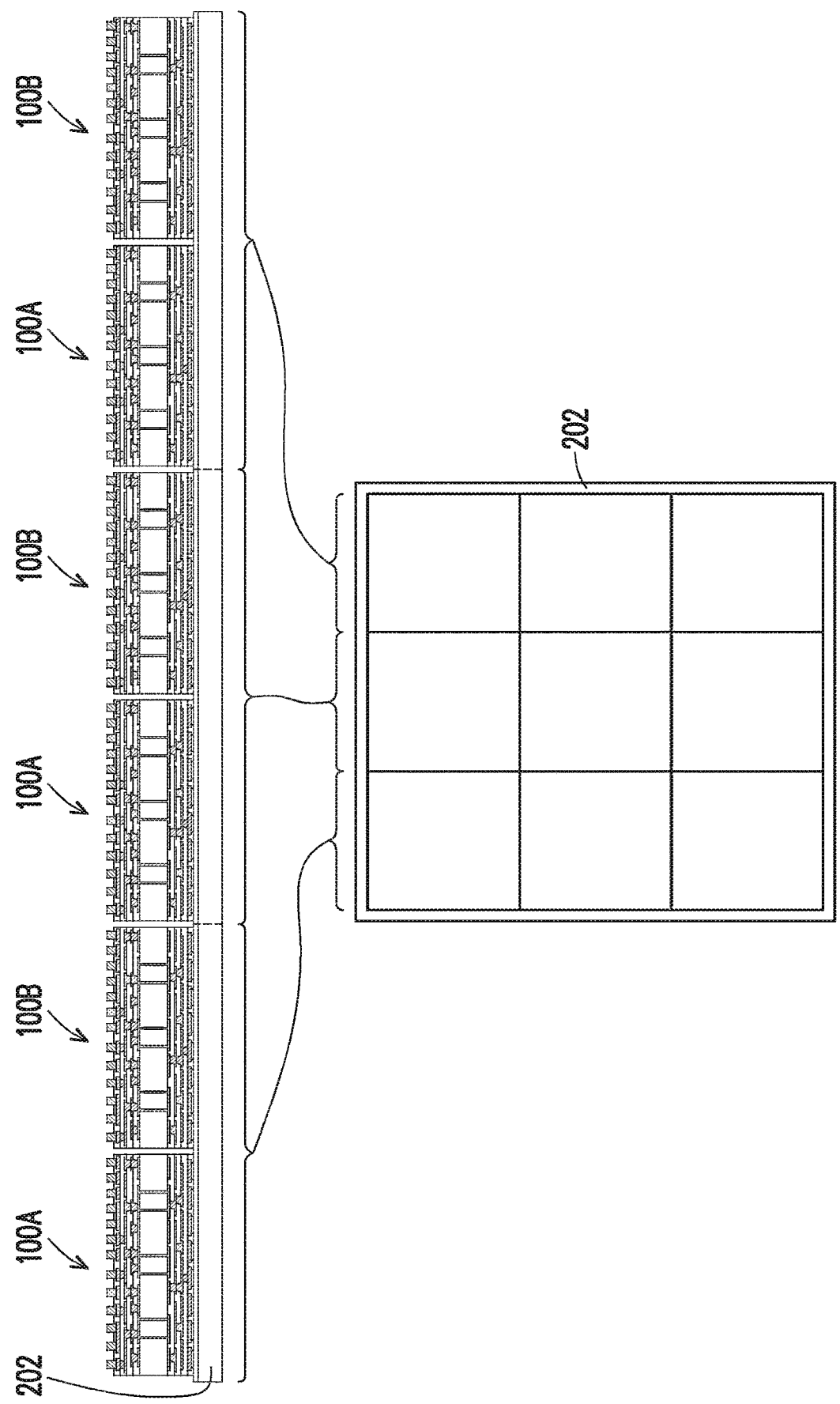

The carrier substrate 202 may include, for example, silicon-based materials, such as a silicon substrate (e.g., a silicon wafer), a glass material, silicon oxide, or other materials, such as aluminum oxide, the like, or a combination. FIG. 2B shows an illustrative example in which the carrier substrate 202 is a silicon wafer. In some embodiments, the carrier substrate 202 may be a panel structure, which may be, for example, a supporting substrate formed from a suitable dielectric material, such as a glass material, a plastic material, or an organic material. The panel structure may be, for example, a rectangular panel. FIG. 2C shows an illustrative example in which the carrier substrate 202 is a panel structure. FIGS. 2B-C show multiple sets of interconnect structures 100A-B attached to the carrier substrates 202. In this manner, multiple structures may be formed simultaneously on a carrier substrate 202. The structures formed on the carrier substrate 202 may be subsequently singulated as part of a process of forming individual package structures 200 (see FIG. 9).

Returning to FIG. 2A, a release layer 203 may be formed on the top surface of the carrier substrate 202 to facilitate subsequent debonding of carrier substrate 202. The release layer 203 may be formed of a polymer-based material, which may be removed along with the carrier substrate 202 from the overlying structures that will be formed in subsequent steps. In some embodiments, the release layer 203 is an epoxy-based thermal-release material, which loses its adhesive property when heated, such as a light-to-heat-conversion (LTHC) release coating. In other embodiments, the release layer 203 may be an ultra-violet (UV) glue, which loses its adhesive property when exposed to UV lights. The release layer 203 may be dispensed as a liquid and cured, may be a laminate film laminated onto the carrier substrate 202, or may be the like. The top surface of the release layer 203 may be leveled and may have a high degree of planarity. In some embodiments, a Die Attach Film (DAF) (not shown) may be used instead of or in addition to the release layer 203.

Figure 3:
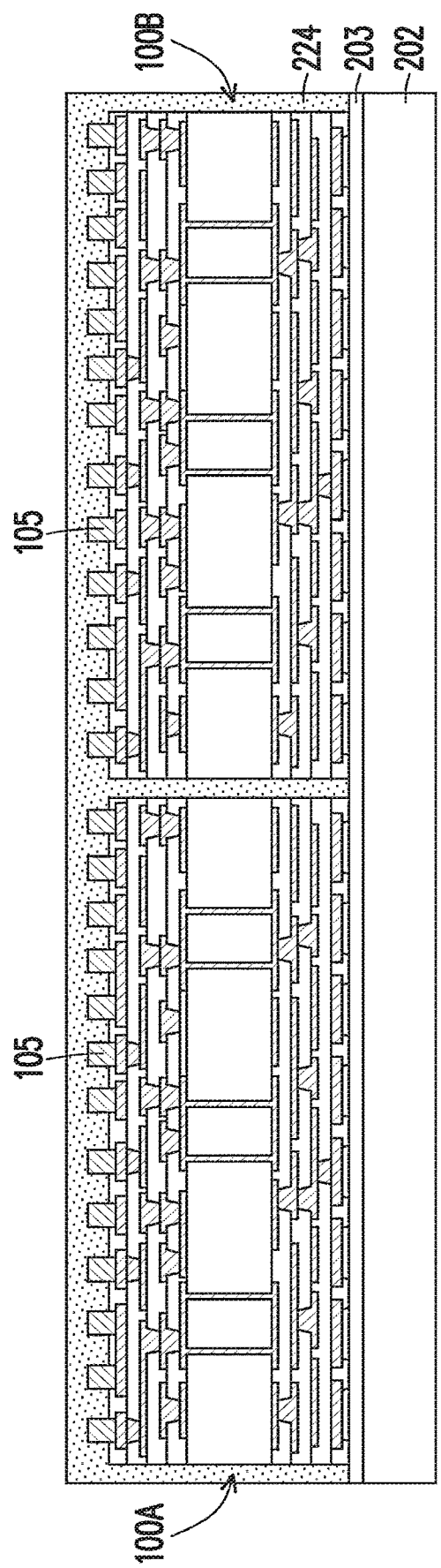
FIGS. 3, 4, 5, 6, 7, 8, and 9 illustrate cross-sectional views of intermediate steps of forming a package structure, in accordance with some embodiments.

In FIG. 3, an underfill 224 is deposited along the sidewalls of the interconnect structures 100A-B and in the gap between the interconnect structures 100A-B. The underfill 224 may cover the conductive pillars 105, as shown in FIG. 3. The underfill 224 may be a material such as a molding compound, an encapsulant, an epoxy, an underfill, a molding underfill (MUF), a resin, or the like. The underfill 224 can protect the conductive pillars 105 and provide structural support for the package structure 200 (see FIG. 9). In some embodiments, the underfill 224 may be applied using a compression molding process, a transfer molding process, or the like. In some embodiments, the underfill 224 may be applied in liquid or semi-liquid form and then subsequently cured.

Figure 4:
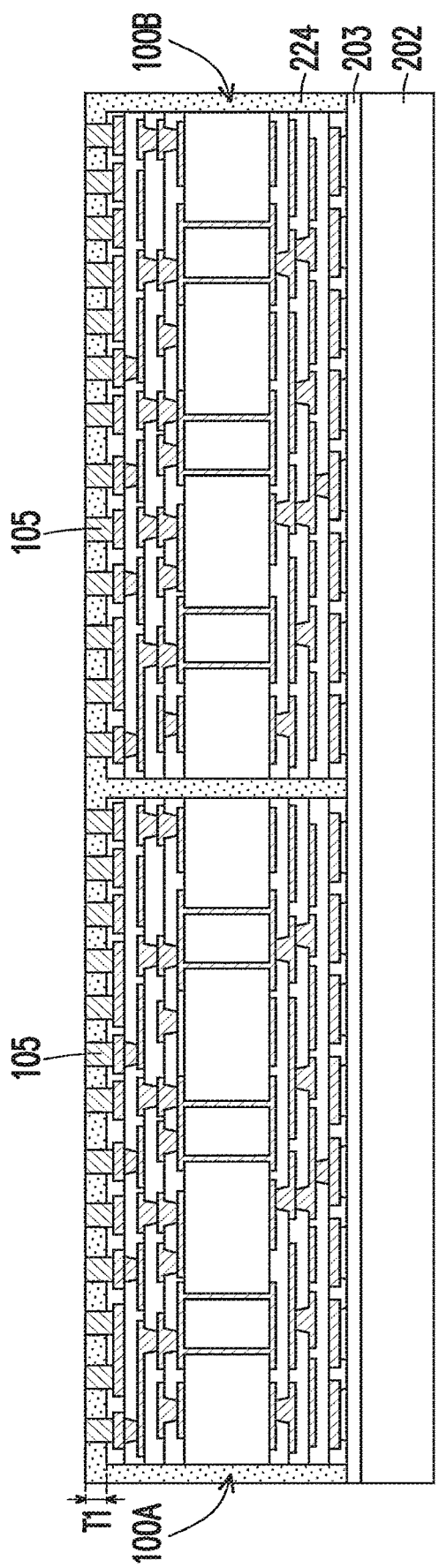

In FIG. 4, a planarization process is performed on the underfill 224, exposing the conductive pillars 105, in accordance with some embodiments. The planarization process may include, for example, a grinding process and/or a chemical-mechanical polish (CMP) process. After performing the planarization process, top surfaces of the conductive pillars 105 and the underfill 224 may be substantially level (e.g., planar) after the planarization process, within process variations. In some cases, the planarization process reduces the height of the conductive pillars. In some embodiments, after performing the planarization process, the thickness T1 of the underfill 224 on the interconnect structures 100A-B may in the range of about 10 µm to about 500 µm, though other thicknesses are possible. The thickness T1 may also correspond to the height the conductive pillars 105 protrude from the interconnect structures 100A-B after planarization, or may also correspond to the vertical distance between the interconnect structures 100A-B and an overlying redistribution structure 208 (see FIG. 6).

Figure 5:
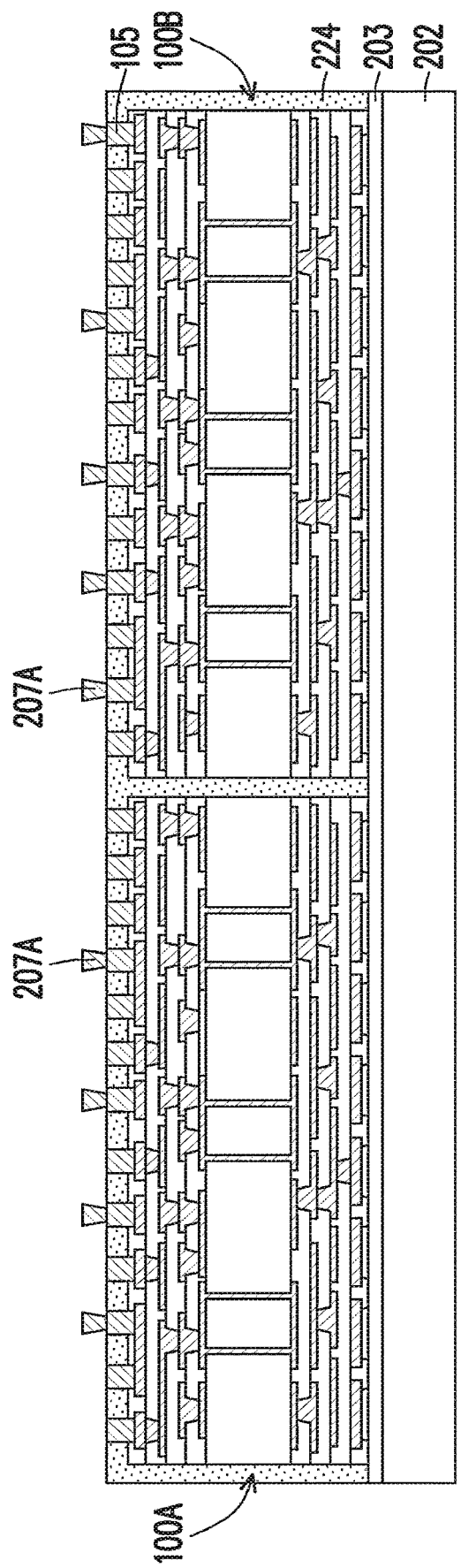

In FIG. 5, conductive vias 207A of the redistribution structure 208 are formed on some or all of the conductive pillars 105, in accordance with some embodiments. The conductive vias 207A make electrical connections between the conductive pillars 105 and subsequently formed conductive lines 205A of the redistribution structure 208. As an example to form the conductive vias 207A, a photoresist is formed and patterned over the underfill 224 and the conductive pillars 105. The photoresist may be formed by spin coating or the like and may be exposed to light for patterning. The patterning of the photoresist forms openings through the photoresist to expose portions of the underlying conductive pillars 105 such that the openings in the photoresist correspond to the pattern of the conductive vias 207A. A conductive material is then formed in the openings of the photoresist and on the exposed portions of the conductive pillars 105. The conductive material may be formed by plating, such as electroplating or electroless plating, or the like. The conductive material may comprise a metal, like copper, titanium, tungsten, aluminum, the like, or combinations thereof. The photoresist may be removed by an acceptable ashing or stripping process.

Figure 6:
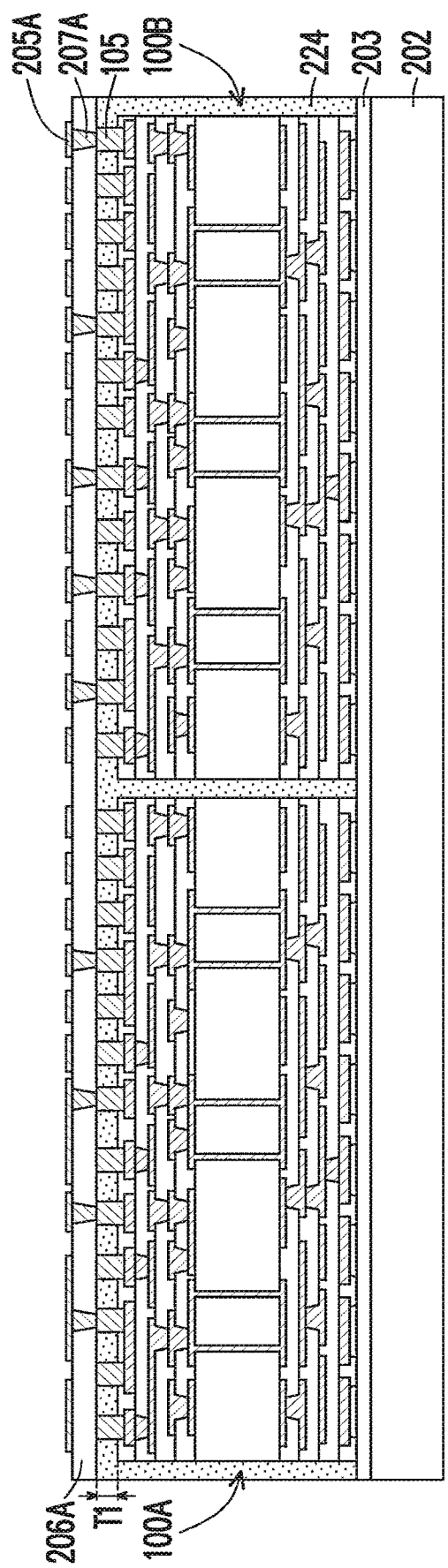

Turning to FIG. 6, after forming the conductive vias 207A, a dielectric layer 206A and conductive lines 205A are formed, in accordance with some embodiments. The dielectric layer 206A is formed over the underfill 224, the conductive pillars 105, and on and around the conductive vias 207A. In some embodiments, the dielectric layer 206A is an encapsulant, such as a pre-preg, resin, resin coated copper (RCC), molding compound, polyimide, photo-imagable dielectric (PID), epoxy, or the like, and may be applied by a suitable technique such as compression molding, transfer molding, spin-on coating, or the like. The encapsulant may be applied in liquid or semi-liquid form and then subsequently cured. In some embodiments, the dielectric layer 206A is formed such that the conductive vias 207A are buried or covered, and a planarization process is then performed on the dielectric layer 206A to expose the conductive vias 207A. The topmost surfaces of the dielectric layer 206A and the conductive vias 207A may be substantially level (e.g., planar) after the planarization process, within process variations. The planarization process may include, for example, a grinding process and/or a CMP process. In some embodiments, the dielectric layer 206A may comprise other materials, such as silicon oxide, silicon nitride, or the like. In some embodiments, the dielectric layer 206A is formed having a thickness in the range of about 5 µm to about 50 µm, though other thicknesses are possible.

The conductive lines 205A of the redistribution structure 208 are then formed on the dielectric layer 206A and the conductive vias 207A, in accordance with some embodiments. The conductive lines 205A may comprise, for example, conductive lines, redistribution layers or redistribution lines, contact pads, or other conductive features extending over a major surface of the dielectric layer 206A. As an example to form the conductive lines 205A, a seed layer is formed over the dielectric layer 206A. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning, in which the pattern of the photoresist corresponds to the conductive lines 205A. The patterning forms openings through the photoresist to expose the seed layer, and then a conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, the like, or combinations thereof. Then, the photoresist and portions of the seed layer on which the conductive material is not formed are removed. The photoresist may be removed by an acceptable ashing or stripping process, such as using an oxygen plasma, a chemical stripping process, or the like. Once the photoresist is removed, exposed portions of the seed layer are removed, such as by using an acceptable etching process, such as by wet or dry etching. The remaining portions of the seed layer and conductive material form the conductive lines 205A. Other techniques of forming the conductive lines 205A are possible. In some cases, the dielectric layer 206A and the metallization pattern, which includes the conductive vias 207A and the conductive lines 205A, form a redistribution layer of the redistribution structure 208.

Figure 7:
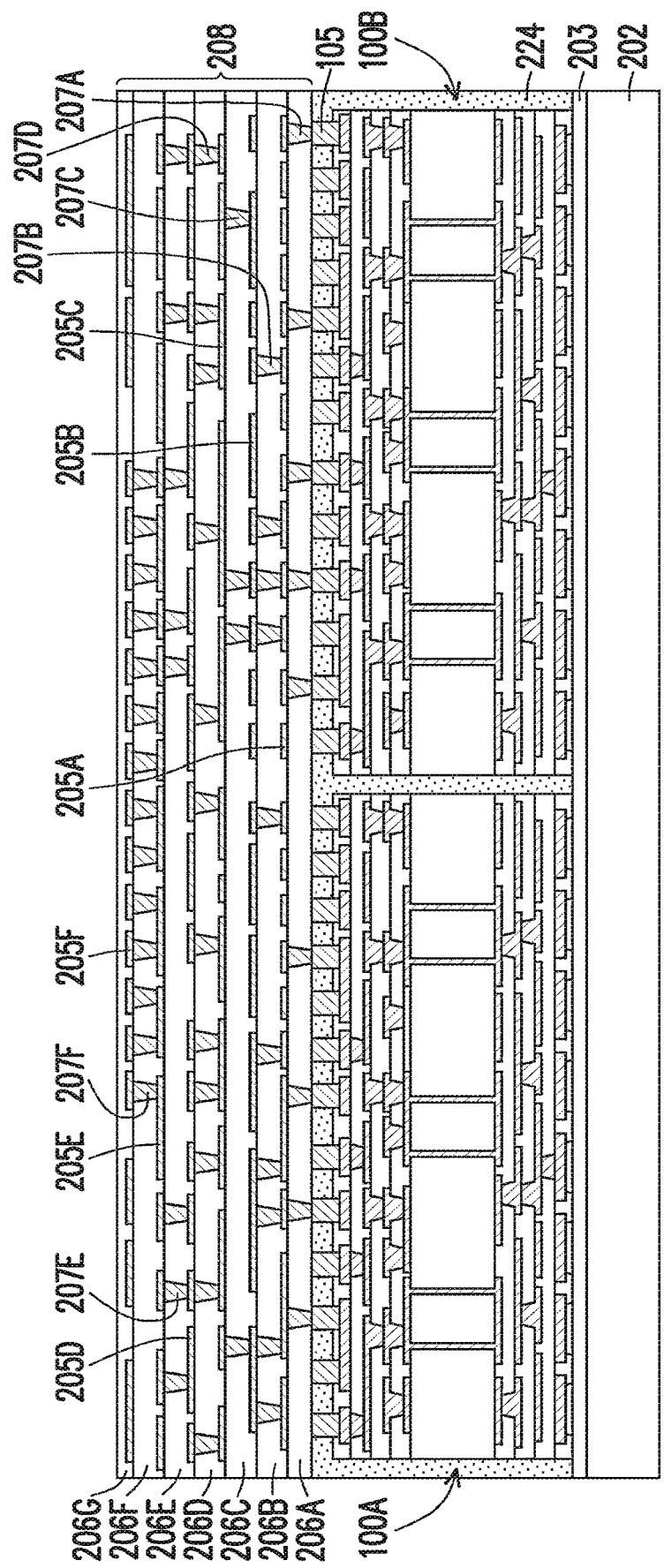

In FIG. 7, the steps and process discussed above are repeated to form additional redistribution layers of the redistribution structure 208, in accordance with some embodiments. The additional redistribution layers shown in FIG. 7 include additional dielectric layers 206B-G; additional conductive lines 205B-F; and additional conductive vias 207B-F. The redistribution layers of the redistribution structure 208 are shown as an example of a redistribution structure 208 comprising six layers of conductive lines, but more or fewer dielectric layers, conductive lines, or conductive vias may be formed for the redistribution structure 208. If fewer redistribution layers are to be formed, some steps and processes discussed below may be omitted. If more redistribution layers are to be formed, some steps and processes discussed below may be repeated.

The additional redistribution layers of the redistribution structure 208 may be formed using similar techniques as described for the dielectric layer 206A, conductive lines 205A, and conductive vias 207A. For example, conductive vias 207B may be formed on the conductive lines 205A, and may be formed in a similar manner and of similar materials as the conductive vias 207A. Dielectric layer 206B may then be formed over the dielectric layer 206A, the conductive lines 205A, and the conductive vias 207B. The dielectric layer 206B may be formed in a similar manner and of similar material as the dielectric layer 206A. A planarization process may be performed on the dielectric layer 206B to expose the conductive vias 207B. Conductive lines 205B may then be formed on the dielectric layer 206B and the conductive vias 207B. The conductive lines 205B make physical and electrical contact with underlying conductive vias 207A. The conductive lines 205B may be formed in a similar manner and of similar materials as the conductive lines 205A. In some embodiments, the conductive lines and/or conductive vias may be formed having different sizes. For example, one or more of the conductive lines or conductive vias may have a different width, pitch, or thickness than other conductive lines or conductive vias. In some embodiments, one or more of the dielectric layers may be formed from different materials or have different thicknesses than other dielectric layers. An example of a redistribution structure 500 having dielectric layers formed from more than one material is described below for FIG. 19.

Steps or processes similar to these may be performed to form the conductive lines 205C, 205D, 205E, and 205F; conductive vias 207B, 207C, 207D, 207E, and 207F; and dielectric layers 206C, 206D, 206E, 206F, and 206G. The topmost dielectric layer 206G may be formed over the topmost conductive lines 205F and the dielectric layer 206E. The topmost dielectric layer 206G may be formed of a material similar to that of the dielectric layers 206A-E or a different material. For example, in some embodiments, the topmost dielectric layer 206G is formed of a polymer, such as polybenzoxazole (PBO), polyimide, benzocyclobutene (BCB), or the like. In other embodiments, the dielectric layer 206G is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 206G may be formed by any acceptable deposition process, such as spin coating, CVD, laminating, the like, or a combination thereof. Although one process for forming the conductive vias 207A-F, dielectric layers 206A-G, and conductive lines 205A-F has been described, it should be appreciated that other processes may be used to form the redistribution layers of the redistribution structure 208. For example, the conductive vias and the conductive lines of a redistribution layer may be formed simultaneously, by forming a single metallization pattern comprising via portions corresponding to the conductive vias and line portions corresponding to the conductive lines. In such embodiments, the line portions of the metallization pattern are on and extend along the major surface of a dielectric layer, and the via portions of the metallization pattern extend through the dielectric layer to physically and electrically couple the conductive lines to underlying conductive features. In such embodiments, no seed layers are formed between the conductive vias and conductive lines of the same redistribution layer.

In FIG. 8, conductive connectors 212 are formed on the redistribution structure 208, in accordance with some embodiments. The conductive connectors 212 allow for physical and electrical connection to dies or another package structure, such as the integrated circuit package 250 (see FIG. 9). In some embodiments, openings may be formed in the topmost dielectric layer (e.g., dielectric layer 206G) of the redistribution structure to expose the topmost conductive lines (e.g., conductive lines 205F) of the redistribution structure 208. The openings expose portions of the conductive lines on which conductive connectors 212 are subsequently formed. The openings may be formed, for example, using a laser drilling process. In other embodiments, the openings may be formed by forming a photoresist over the dielectric layer 206G, patterning the photoresist, and etching the dielectric layer 206G through the patterned photoresist using a suitable etching process (e.g., a wet etching process and/or a dry etching process).

The conductive connectors 212 may then be formed on the conductive lines 205F, making electrical connection to the redistribution structure 208. The conductive connectors 212 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 212 may include a conductive material such as solder, copper, aluminum, gold, nickel, silver, palladium, tin, the like, or a combination thereof. In some embodiments, the conductive connectors 212 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 212 comprise metal pillars (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In some embodiments, UBMs (not shown) are formed on the conductive lines 205F before forming the conductive connectors 212.

FIG. 9 illustrates the attachment of an integrated circuit package 250 to the conductive connectors 212 to form a package structure 200, in accordance with some embodiments. In some embodiments, the carrier substrate 202 is de-bonded to detach (or "de-bond") the carrier substrate 202. In some embodiments, the de-bonding includes projecting a light such as a laser light or an UV light on the release layer 203 of the carrier substrate 202 so that the release layer 203 decomposes under the heat of the light and the carrier substrate 202 can be removed. Multiple structures may be formed on the carrier substrate 202 and may then be singulated to form individual structures, which are subsequently processed to form individual package structures 200. The structures may be singulated, for example using one or more saw blades that separate the structure into discrete pieces, forming one or more singulated structures. However, any suitable method of singulation, including laser ablation or one or more wet etches, may also be utilized. The singulation process may leave underfill 224 remaining on the sidewalls of the interconnect structures 100, or the singulation process may remove underfill 224 from the sidewalls of the interconnect structures 100. After the singulation process, the redistribution structure 208 may have sidewalls that are coplanar with the sidewalls of the interconnect structures 100, or the redistribution structure 208 may have sidewalls that are coplanar with the underfill 224 remaining on the sidewalls of the interconnect structures 100. In some embodiments, the thickness of the underfill 224 remaining on the sidewalls of the interconnect structures 100 may have a thickness D4 that is in the range of about 40 μm to about 5,000 μm, though other thicknesses are possible. The thickness D4 may also correspond to a lateral offset between a sidewall of the redistribution structure 208 and an interconnect structure 100.

One or more integrated circuit packages 250 are physically and electrically connected to the conductive connectors 212 to make electrical connection between the integrated circuit package(s) 250 and the redistribution structure 208. The integrated circuit package(s) 250 may be placed on the conductive connectors 212 using a suitable process such as a pick-and-place process. FIG. 9 shows the attachment of one integrated circuit package 250, but in other embodiments, one, two, or more than three integrated circuit package 250 may be attached to the conductive connectors 212. In some embodiments, the integrated circuit package 250 attached to the conductive connectors 212 may include more than one of the same type of integrated circuit package or may include two or more different types of integrated circuit package. FIG. 9 illustrates a package structure 200 after singulation, which may be performed at any suitable previous step during the formation process. In some embodiments, the lateral distance between opposite sides of the package structure 200 is between about 30 mm and about 500 mm, though other distances are possible.

The integrated circuit package 250 may include one or more integrated circuit dies 252, in some embodiments. The cross-sectional view of FIG. 9 shows three integrated circuit dies 252A-C, but an integrated circuit package 250 may include more or fewer integrated circuit dies 252 than shown. The integrated circuit dies 252 may comprise, for example, a logic die (e.g., central processing unit (CPU), graphics processing unit (GPU), system-on-a-chip (SoC), component-on-a-wafer (CoW), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an input-output (I/O) die, the like, or combinations thereof. For example, in some embodiments, the integrated circuit package 250 includes a logic die 252B and multiple I/O dies 252A and 252C that interface with the logic die 252B, though other combinations of integrated circuit dies 252 are possible. The integrated circuit dies 252 may be a memory device such as a hybrid memory cube (HMC) module, a high bandwidth memory (HBM) module, or the like that includes multiple memory dies. The integrated circuit dies 252 may be formed in one or more wafers, which may include different device regions that are singulated in subsequent steps. The integrated circuit dies 252 may be packaged with other similar or different integrated circuit dies 252 using known manufacturing techniques.

The integrated circuit package 250 may include a routing structure 254 that provides electrical routing and connections between, for example, the integrated circuit dies 252. The routing structure 254 may also provide connection from the integrated circuit package 250 to the conductive connectors 212. The routing structure 254 may comprise one or more redistribution layers, an integrated fan-out structure (InFO), through-substrate vias (TSVs), metallization patterns, electrical routing, conductive lines, conductive vias, the like, or combinations thereof.

The integrated circuit package 250 may be placed such that conductive regions of the integrated circuit package 250 (e.g., contact pads, conductive connectors, solder bumps, or the like, which may be part of the routing structure 254) are aligned with corresponding conductive connectors 212 on the redistribution structure 208. Once in physical contact, a reflow process may be utilized to bond the conductive connectors 212 to the integrated circuit package 250, forming the package structure 200. As shown in FIG. 9, an underfill 214 may be deposited between the integrated circuit package 250 and the redistribution structure 208. The underfill 214 may also at least partially surround the conductive connectors 212. The underfill 214 may be a material such as a molding compound, an epoxy, an underfill, a molding underfill (MUF), a resin, or the like, and may be similar to underfill 224 described previously.

Still referring to FIG. 9, external connectors 216 may be formed on the interconnect structures 100. In some embodiments, UBMs are first formed on the interconnect structures 100, and the external connectors 216 are formed over the UBMs. The external connectors 216 may be, for example, contact bumps or solder balls, although any suitable types of connectors may be utilized. In an embodiment in which the external connectors 216 are contact bumps, the external connectors 216 may include a material such as tin, or other suitable materials, such as silver, lead-free tin, or copper. In an embodiment in which the external connectors 216 are solder bumps, the external connectors 216 may be formed by initially forming a layer of solder using such a technique such as evaporation, electroplating, printing, solder transfer, ball placement, etc. Once a layer of solder has been formed on the structure, a reflow may be performed in order to shape the material into the desired bump shape for the external connectors 216. In some embodiments, the external connectors 216 may have a pitch that is between about 100 μm and about 1,500 μm, though other distances are possible. In this manner, a package structure 200 may be formed.

In some embodiments, an optional supporting ring 220 is attached to the package structure 200 to provide further mechanical support to reduce the warpage of the package structure 200. The supporting ring 220 may be attached to the package structure 200 by an adhesive, an adhesive film, or the like. The supporting ring 220 may be a material such as metal, though other materials may be used. In some cases, the outer edges of the supporting ring 220 may be flush with the sidewalls of the package structure 200. A supporting ring 220 may have a thickness between about 50 μm and about 1,500 μm, though other thicknesses are possible.

FIG. 10 illustrates a plan view of the structure shown in FIG. 9, with the cross-section of FIG. 9 being through the reference cross-section A-A shown in FIG. 10. Some of the features shown in FIG. 9, such as the optional supporting ring 220, have been omitted from FIG. 10 for clarity reasons. The dashed outlines show the locations of interconnect structures 100 within the package structure 200. FIG. 10 illustrates four interconnect structures 100, but in other embodiments more or fewer interconnect structures 100 may be present, the interconnect structures 100 may be different sizes or shapes than shown, or the interconnect structures 100 may have a different arrangement than shown. In some embodiments, one or both sides of a package structure 200 may have a length L2 that is between about 30 mm and about 500 mm, though other lengths are possible.

In some cases, by forming a redistribution structure 208 over multiple interconnect structures 100 as described herein, stress or warpage of the package structure 300 can be reduced. The use of multiple interconnect structures 100 in a package structure 200 can reduce manufacturing cost, reduce assembly time, and reduce warping of the package structure 200. For example, by planarizing the underfill 224 and conductive pillars 105 as shown in FIG. 4, greater planarity of the overlying redistribution structure 208 may be achieved. By reducing the warping of the package structure 200, the risk of problems for the conductive connectors 212 between the integrated circuit package 250 and the redistribution structure 208 may be reduced or eliminated. Such problems may include joint failure, joint cracking, bump fatigue, cold joints, high stress, or the like. In this manner, the techniques described herein can improve device reliability, yield, and performance.

Figure 11:
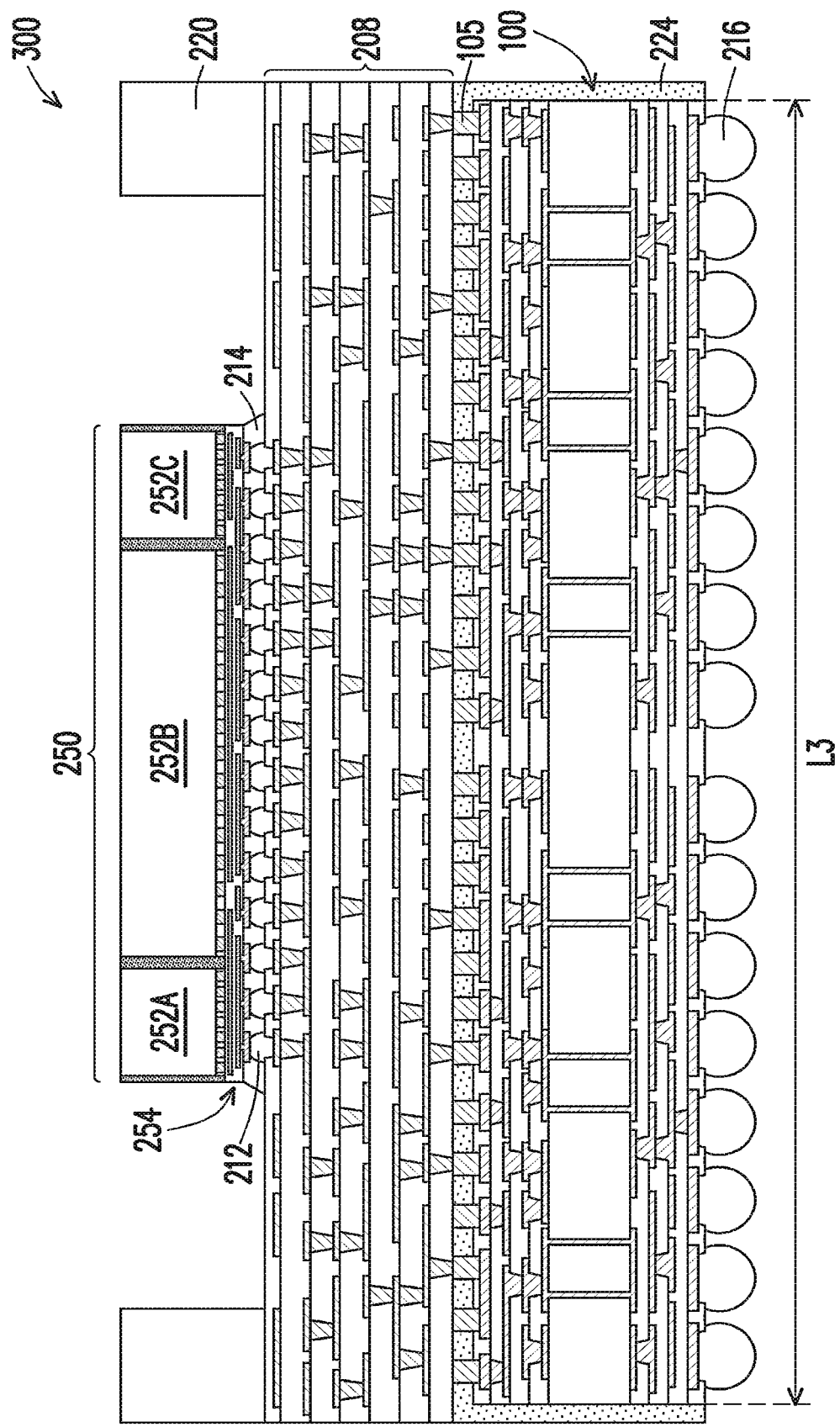
FIG. 11 illustrates a cross-sectional view of an intermediate step of forming a package structure, in accordance with some embodiments.

FIG. 11 illustrates a cross-sectional view of a package structure 300 that includes a single interconnect structure 100, in accordance with some embodiments. The package structure 300 is similar to the package structure 200 shown in FIG. 9, except that the package structure 300 includes a single interconnect structure 100 rather than multiple interconnect structures 100. In embodiments having a single interconnect structure 100, the single interconnect structure 100 may have a length L3 that is between about 15 mm and about 500 mm, though other lengths are possible. The interconnect structure 100 shown in FIG. 11 includes conductive pillars 105, which allows for the formation of a redistribution structure 208 over the interconnect structure 100, similar to the process described for FIGS. 3-7. The techniques described herein can also reduce warpage of a package structure that includes a single interconnect structure 100, which can improve device reliability, yield, and performance as described previously.

FIGS. 12 through 18 illustrate intermediate steps in the formation of a package structure 400 (see FIG. 18), in accordance with some embodiments. The package structure 400 is similar to the package structure 200 shown in FIG. 9, except that a second redistribution structure 408 is formed over a first redistribution structure 402, and the second redistribution structure 408 is formed using different techniques than the first redistribution structure 402. The first redistribution structure 402 may be similar to the redistribution structure 208 described previously and formed using similar techniques. The second redistribution structure 408 may be formed using techniques that allow for the formation of smaller conductive lines (e.g., "fine line" processes, which may include silicon fab manufacturing processes), such as conductive lines having a width of about 2 μm or less. In some cases, the use of a different technique to form a second redistribution structure 408 can result in improved electrical performance, described in greater detail below. In some embodiments, the second redistribution structure 408 may have sidewalls that are coplanar with the sidewalls of the first redistribution structure 402.

Figure 12:
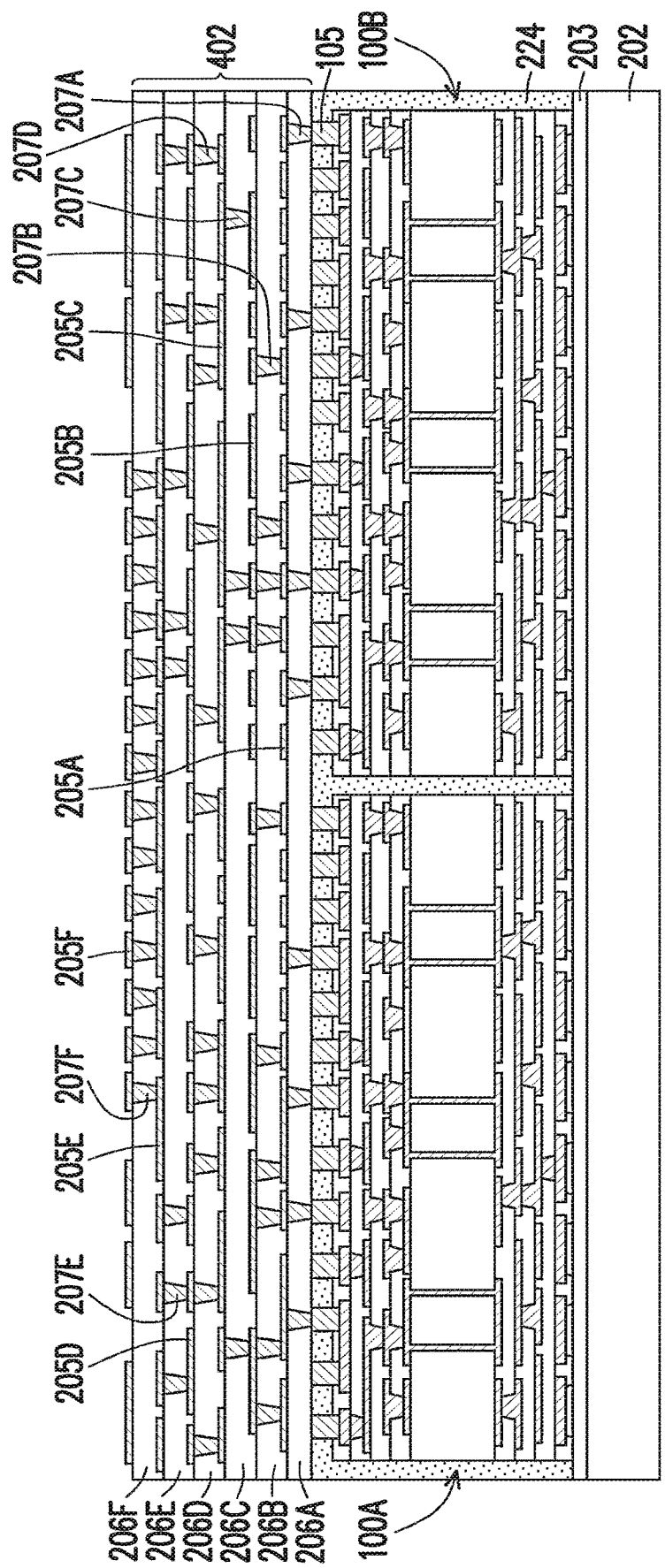
FIGS. 12, 13, 14, 15, 16, 17, and 18 illustrate cross-sectional views of intermediate steps of forming a package structure, in accordance with some embodiments.

FIG. 12 illustrates the first redistribution structure 402 formed over interconnect structures 100A-B, in accordance with some embodiments. The first redistribution structure 402 shown in FIG. 12 may be similar to the redistribution structure 208 shown in FIG. 7, except that the topmost dielectric layer 206G is not formed over the topmost conductive lines 205F. The first redistribution structure 402 may be formed using similar materials and techniques as the redistribution structure 208. For example, the first redistribution structure 402 includes multiple conductive lines 205A-F, multiple dielectric layers 206A-F, and multiple conductive vias 207A-F. The first redistribution structure 402 is shown as an illustrative example, and more or fewer conductive lines, dielectric layers, and/or conductive vias may be used in other embodiments.

FIGS. 13 through 16 illustrate intermediate steps in the formation of the second redistribution structure 408 (see FIG. 16), in accordance with some embodiments. The second redistribution structure 408 includes metallization patterns 405A-C and dielectric layers 406A-D. The second redistribution structure 408 may have a different number of metallization patterns or dielectric layers than shown. If fewer redistribution layers of the second redistribution structure 408 are to be formed, some steps and processes discussed below may be omitted. If more redistribution layers are to be formed, some steps and processes discussed below may be repeated.

Figure 13:
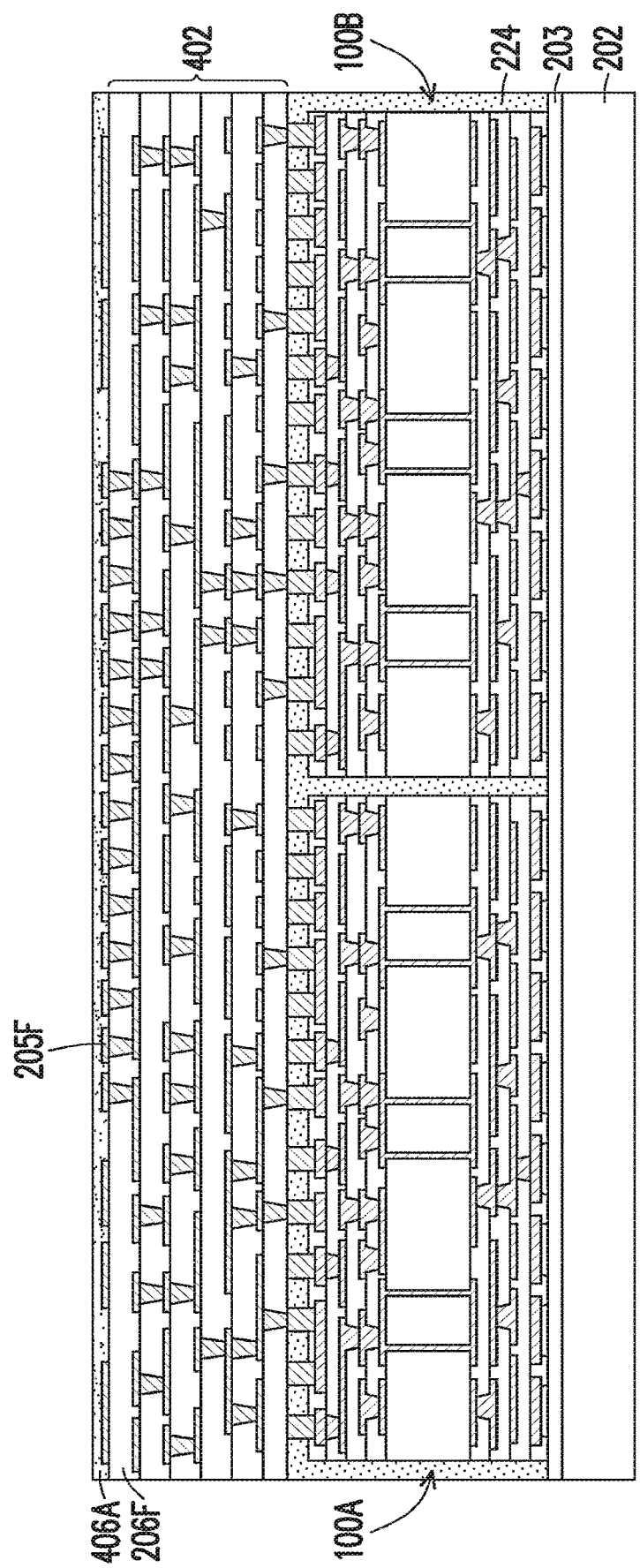

In FIG. 13, a dielectric layer 406A is formed on the first redistribution structure 402. The dielectric layer 406A is formed over the dielectric layer 206F and the conductive lines 205F. In some embodiments, the dielectric layer 406A is formed of a polymer, such as polybenzoxazole (PBO), polyimide, benzocyclobutene (BCB), or the like. In some embodiments, the dielectric layer 406A is formed of a photosensitive material such as PBO, polyimide, BCB, or the like, which may be patterned using a lithography process. In other embodiments, the dielectric layer 406A is formed of a nitride such as silicon nitride; an oxide such as silicon oxide, phosphosilicate glass (PSG), borosilicate glass (BSG), boron-doped phosphosilicate glass (BPSG), or the like; the like, or combinations thereof. The dielectric layer 406A may be formed by any acceptable deposition process, such as spin coating, chemical vapor deposition (CVD), laminating, the like, or a combination thereof.

Figure 14:
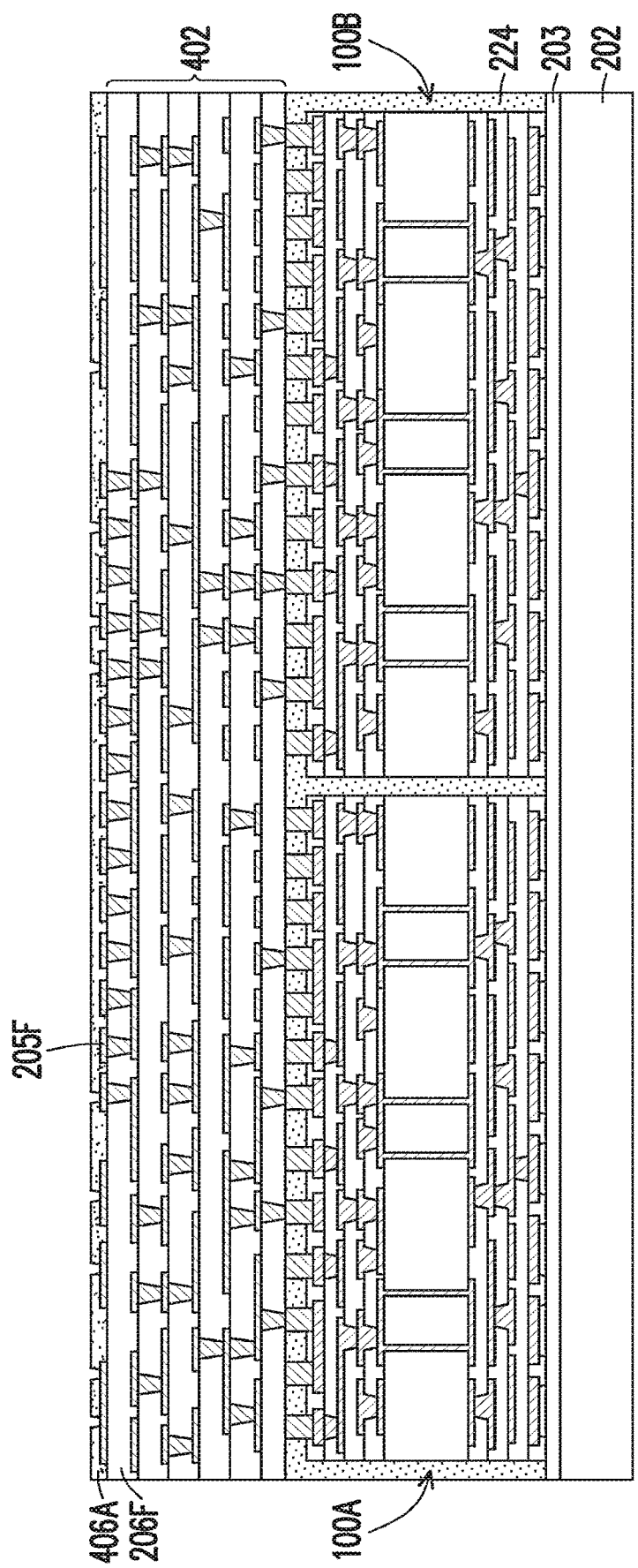

In FIG. 14, the dielectric layer 406A is patterned to form openings that expose portions of the conductive lines 205F. The patterning may be performed using an acceptable process, such as by exposing to light and developing the dielectric layer 406A when the dielectric layer 406A is a photosensitive material or by etching using, for example, an anisotropic etch when the dielectric layer 406A is not photosensitive.

Figure 15:
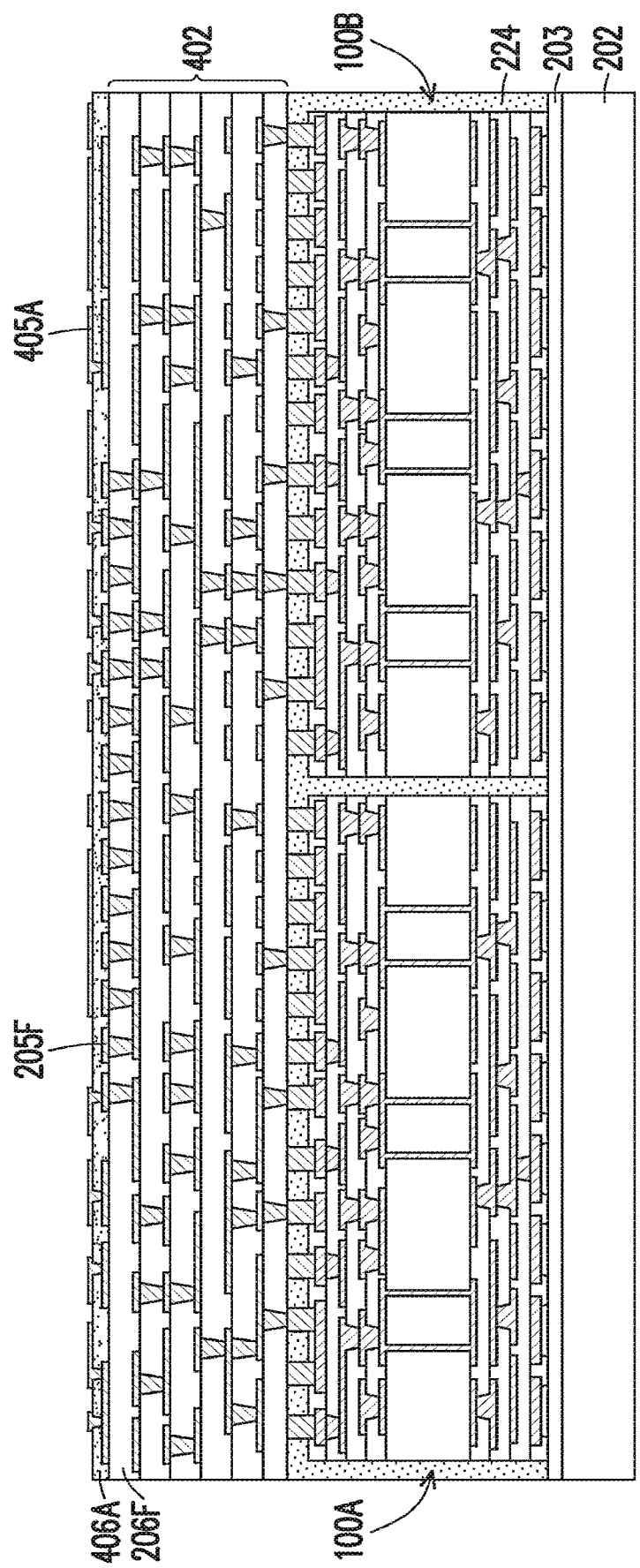

In FIG. 15, a metallization pattern 405A is formed over the dielectric layer 406A, in accordance with some embodiments. The metallization pattern 405A includes conductive elements extending along the major surface of the dielectric layer 406A and extending through the dielectric layer 406A to physically and electrically couple to an underlying conductive layer (e.g., the conductive lines 205F). As an example to form the metallization pattern 405A, a seed layer is formed over the dielectric layer 406A and in the openings extending through the dielectric layer 406A to conductive lines 205F. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photoresist is then formed and patterned on the seed layer. The photoresist may be formed by spin coating or the like and may be exposed to light and developed for patterning. The patterning forms openings through the photoresist to expose the seed layer, with the pattern of the openings corresponding to the metallization pattern 405A. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 405A. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The combination of the dielectric layer 406A and the metallization pattern 405A form a redistribution layer of the second redistribution structure 408.

Figure 16:
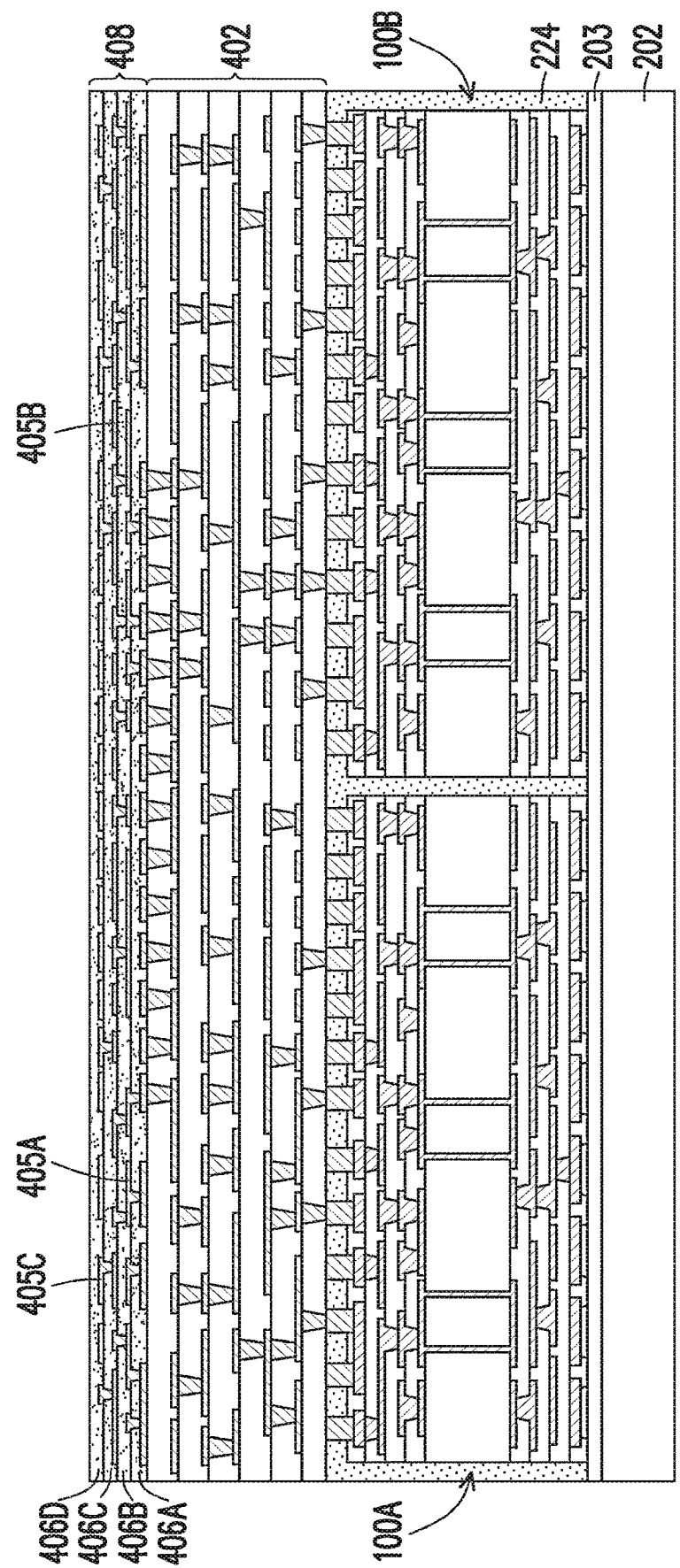

In FIG. 16, the remaining dielectric layers 406B-D and metallization patterns 405B-C of the second redistribution structure 408 are formed, in accordance with some embodiments. The dielectric layers 406B-D and the metallization patters 405B-C may be formed using similar materials and techniques as the dielectric layer 406A and the metallization pattern 405A. In some embodiments, some or all of the dielectric layers of the second redistribution structure 408 may be thinner than the dielectric layers of the first redistribution structure 402. In some embodiments, one or more of the dielectric layers of the second redistribution structure 408 may have a different thickness than other dielectric layers of the second redistribution structure 408. In some embodiments, the dielectric layers of the second redistribution structure 408 each have a thickness in the range of about 2 μm to about 15 μm, although other thicknesses are possible.

In some embodiments, the metallization patterns of the second redistribution structure 408 may have a different size than conductive lines and/or conductive vias of the first redistribution structure 402. For example, the conductive lines and/or conductive vias of the first redistribution structure 402 may be wider or thicker than the conductive lines and/or vias of the metallization patterns of the second redistribution structure 408, thereby allowing for longer horizontal routing.

In some embodiments, the conductive lines of the metallization patterns of the second redistribution structure 408 each have a thickness in the range of about 0.5 μm to about 5 μm, although other thicknesses are possible. In some embodiments, the metallization patterns of the second redistribution structure 408 may be formed having linewidths or line spaces less than about 2 μm. In some cases, using a different process to form the second redistribution structure 408 than used to form the first redistribution structure 402 allows for smaller feature sizes to be formed within the second redistribution structure 408. For example, by using silicon fab processing techniques to form the second redistribution structure 408, the metallization patterns of the second redistribution structure 408 may be formed having a smaller roughness. Conductive features having a smaller roughness can have a smaller insertion loss and less skin effect, and thus signal integrity within the second redistribution structure 408 can be improved. Additionally, the dielectric layers of the second redistribution structure 408 may be formed having a smaller thickness, which can reduce the equivalent series resistance (ESR) or the equivalent series inductance (ESL) of the dielectric layers, which can improve the power integrity of the package structure 400. By forming a second redistribution structure 408 having finer features in this manner, the high speed operation of the package structure 400 can be improved.

Figure 17:
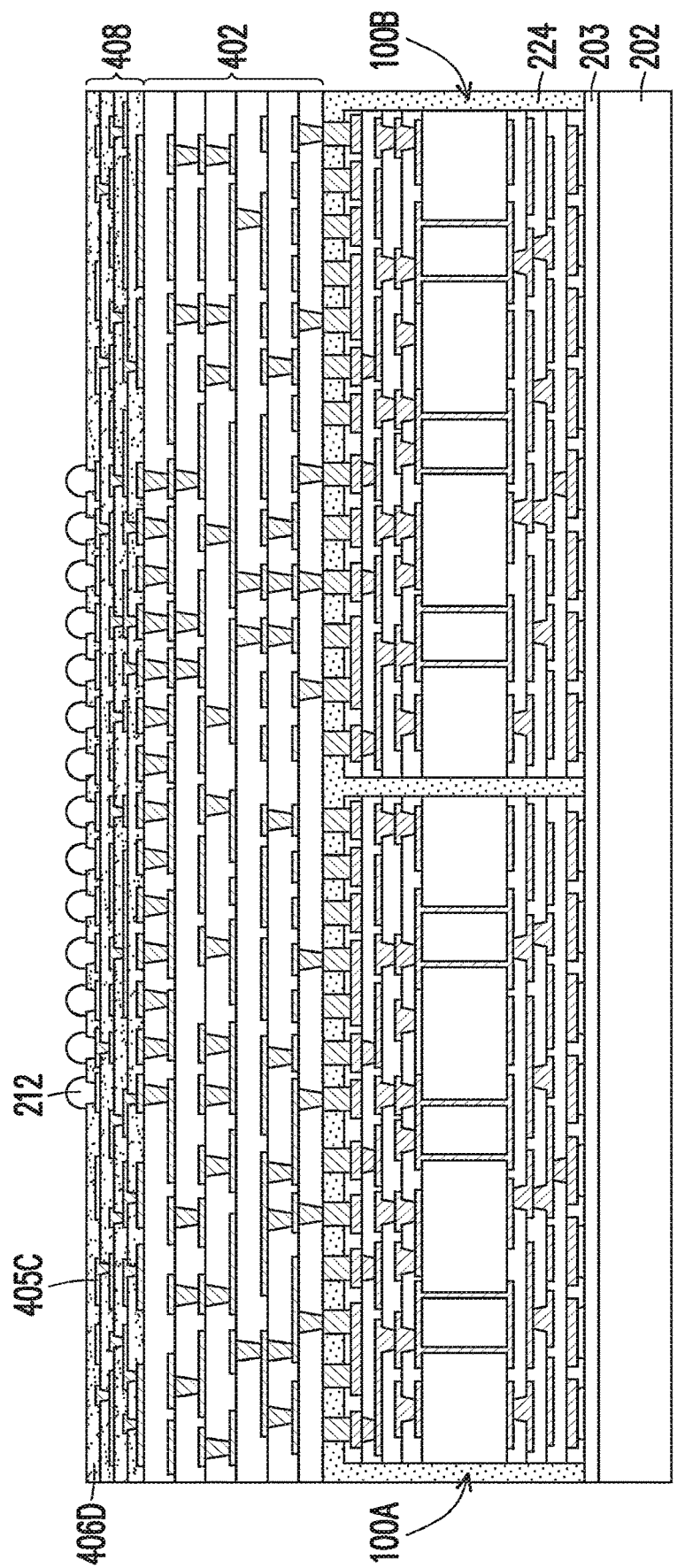

In FIG. 17, conductive connectors 212 are formed on the second redistribution structure 408, in accordance with some embodiments. The conductive connectors 212 allow for physical and electrical connection to dies or another package structure, such as the integrated circuit package 250 (see FIG. 18). In some embodiments, openings may be formed in the topmost dielectric layer (e.g., dielectric layer 406D) of the second redistribution structure 408 to expose the topmost conductive lines (e.g., conductive lines 405C) of the second redistribution structure 408. The openings expose portions of the conductive lines on which conductive connectors 212 are subsequently formed. The openings may be formed, for example, using a laser drilling process. In other embodiments, the openings may be formed by forming a photoresist over the dielectric layer 406D, patterning the photoresist, and etching the dielectric layer 406D through the patterned photoresist using a suitable etching process (e.g., a wet etching process and/or a dry etching process).

The conductive connectors 212 may then be formed on the conductive lines 405C, making electrical connection to the second redistribution structure 408. The conductive connectors 212 may be similar to the conductive connectors 212 described for FIG. 8, and may be formed in a similar manner. In some embodiments, UBMs (not shown) are formed on the conductive lines 405C before forming the conductive connectors 212.

Figure 18:
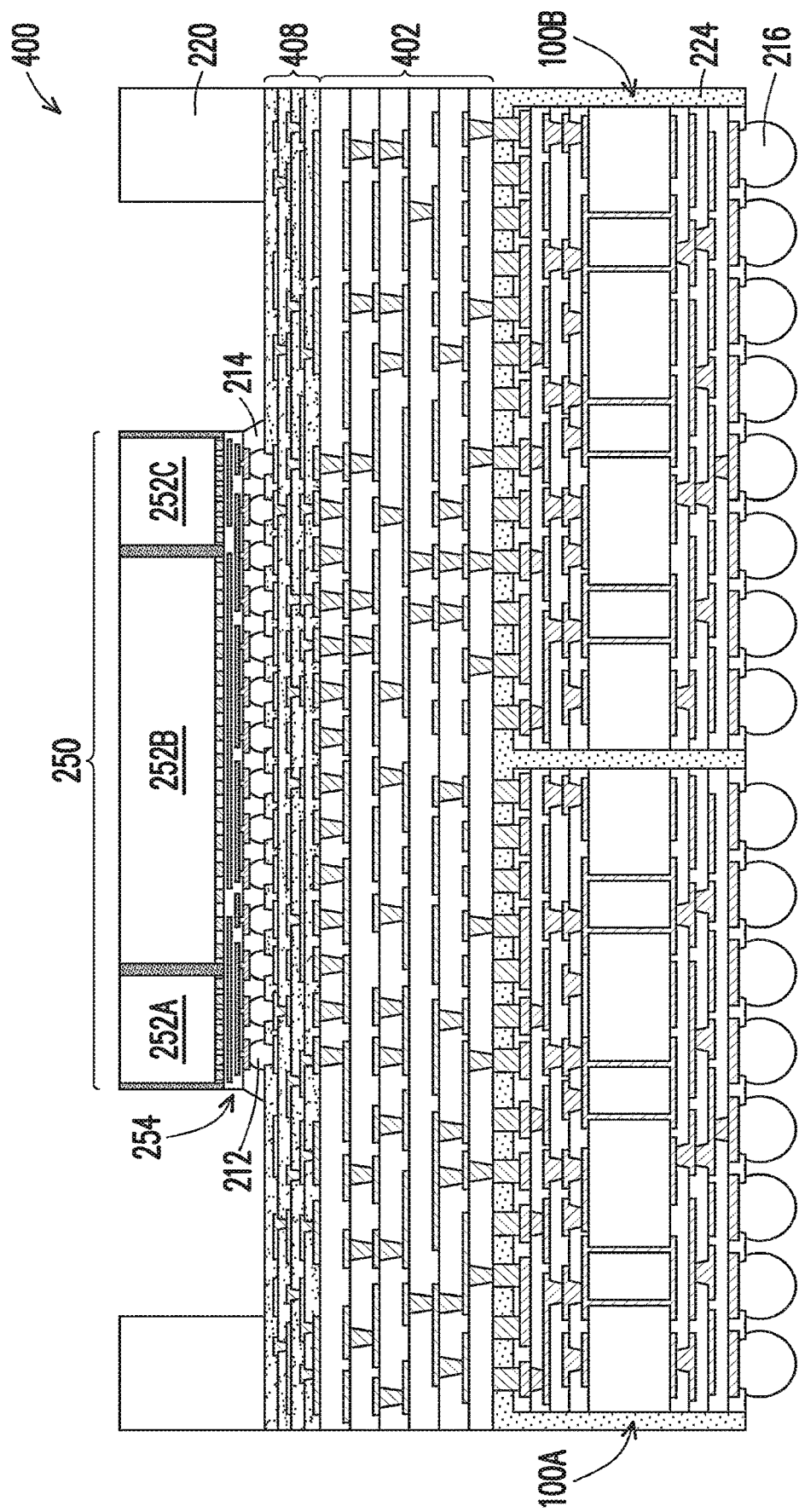

FIG. 18 illustrates the attachment of an integrated circuit package 250 to the conductive connectors 212 to form a package structure 400, in accordance with some embodiments. The integrated circuit package 250 may be similar to the integrated circuit package 250 described previously for FIG. 9, and may be attached in a similar manner. The integrated circuit package 250 is physically and electrically connected to the conductive connectors 212 to make electrical connection between the integrated circuit package 250 and the second redistribution structure 408. Additionally, external connectors 216 and/or a supporting ring 220 may be formed in a manner similar to that described previously for FIG. 9.

Figure 19:
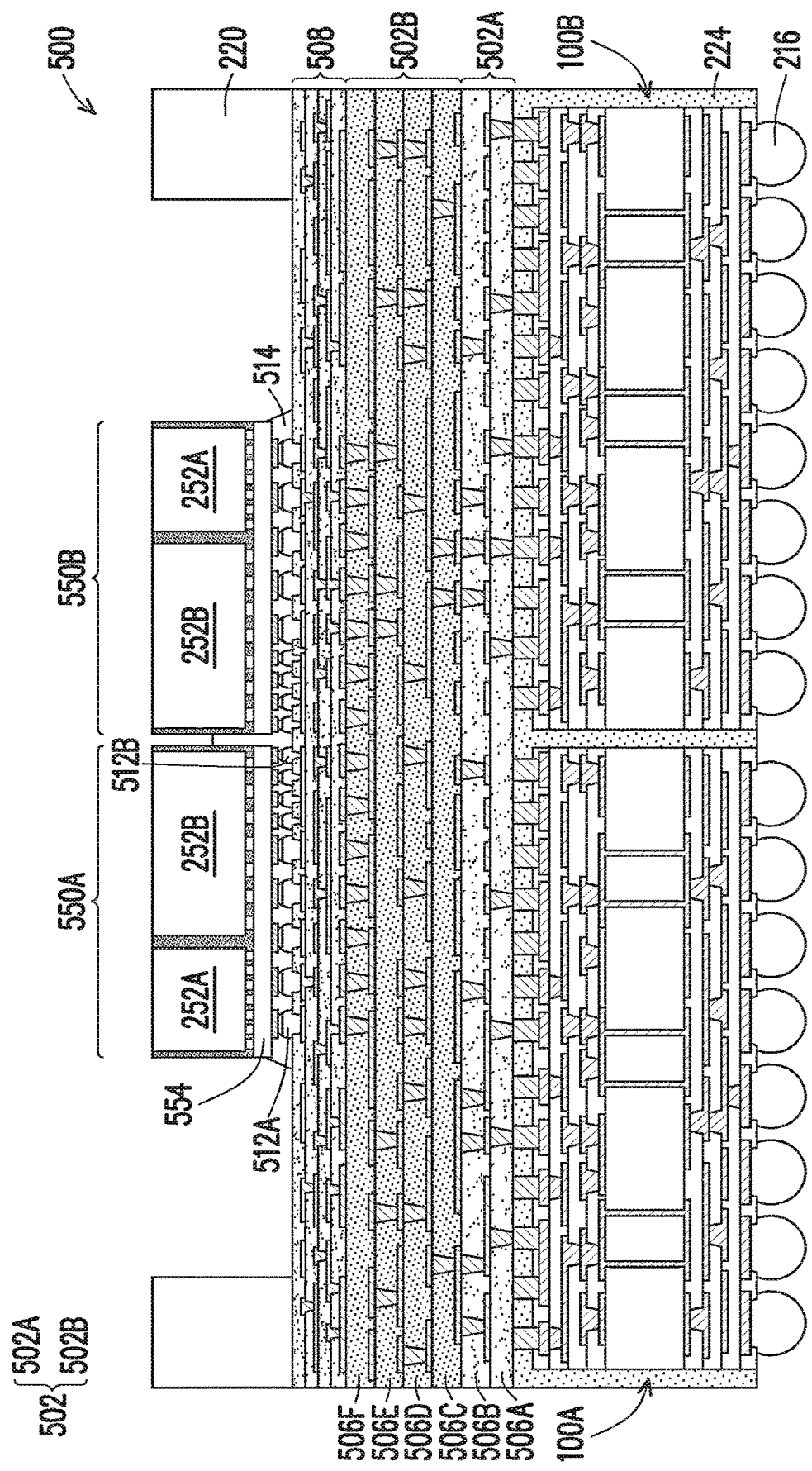
FIG. 19 illustrates a cross-sectional view of an intermediate step of forming a package structure, in accordance with some embodiments.

FIG. 19 illustrates an intermediate step in the formation of a package structure 500, in accordance with some embodiments. The package structure 500 is similar to the package structure 400 shown in FIG. 18, except that a first redistribution structure 502 includes first redistribution layers 502A and second redistribution layers 502B that are formed using different dielectric materials. Additionally, the package structure 500 shown in FIG. 19 has two integrated circuit packages 550A and 550B attached to a second redistribution structure 508, which is formed over the first redistribution structure 502.

The first redistribution layers 502A and/or the second redistribution layers 502B of the redistribution structure 502 may be formed using techniques similar to that described previously for the redistribution structure 208. The first redistribution structure 502 includes first redistribution layers 502A having dielectric layers 506A-B formed using a first dielectric material and second redistribution layers 502B having dielectric layers 506C-F formed using a second dielectric material that is different from the first dielectric material. For example, the second dielectric material may be a molding compound having a different composition than the first dielectric material, though other dielectric materials are possible. The first dielectric material or the second dielectric material may be similar to the dielectric materials described previously for the dielectric layers 206A-G (see FIGS. 6-7), or may be another dielectric material. The first redistribution structure 502 is an example of a redistribution structure formed having redistribution layers of more than one material, in accordance with some embodiments. In other embodiments, one or more of any of the dielectric layers within a redistribution structure (e.g., redistribution structures 208, 402, or 502) may be formed using a dielectric material that is different from that of the other dielectric layers. The first redistribution structure 502 is shown as an illustrative example, and more or fewer conductive lines, dielectric layers, and/or conductive vias may be used in other embodiments.

In some embodiments, the conductive lines and/or conductive vias of the first redistribution layers 502A may be formed having different sizes than those of the second redistribution layers 502B. For example, one or more of the conductive lines or conductive vias of the first redistribution layers 502A may have a different width, pitch, or thickness than one or more of the conductive lines or conductive vias of the second redistribution layers 502B. In some embodiments, one or more of the dielectric layers 506A-B of the first redistribution layers 502A may be formed having different thicknesses than one or more of the dielectric layers 506C-F of the second redistribution layers 502B.

In some cases, forming a redistribution structure 502 having different dielectric layers made of different materials can allow for improved device performance. For example, one or more redistribution layers of the first redistribution structure 502 may be formed using a dielectric material that is relatively better suited for the type of electrical signal conducted in those redistribution layers. For example, redistribution layers through which high frequency signals are conductive may be formed using a dielectric material having a relatively lower signal loss at higher frequencies, such as a material having a relatively low dissipation factor. By reducing signal loss, resistance, and/or inductance in this manner by using a different dielectric material for certain redistribution layers, the signal integrity and efficiency of the package may be improved and electronic noise of the package may be reduced, particularly at higher speed operation. As another example, other dielectric materials, such as those that provide relatively better insulation, may be better suited for redistribution layers that conduct electrical power between components. These are examples, and various dielectric materials may be selected for these or other characteristics or benefits.

The second redistribution structure 508 may be formed on the first redistribution structure 502, in accordance with some embodiments. The second redistribution structure 508 shown in FIG. 19 may be similar to the second redistribution structure 408 shown in FIG. 18, and may be formed using similar materials and techniques as the second redistribution structure 408. In other embodiments, the second redistribution structure 508 may not be present.

Conductive connectors 512A-B may then be formed on the second redistribution structure 508, making electrical connection to the second redistribution structure 508. The conductive connectors 512A-B may be similar to the conductive connectors 212 described for FIG. 8, except that the conductive connectors 512A have a larger size and have a larger pitch than the conductive connectors 512B. The conductive connectors 512A-B may be formed in a similar manner as the conductive connectors 212. In some embodiments, UBMs (not shown) are formed on the second redistribution structure 508 before forming the conductive connectors 512A-B.

FIG. 19 illustrates the attachment of multiple integrated circuit packages 550 (e.g., integrated circuit packages 550A and 550B) to the conductive connectors 512A-B to form a package structure 500, in accordance with some embodiments. The integrated circuit packages 550 may be similar to the integrated circuit package 250 described previously for FIG. 9, and may be attached in a similar manner. For example, the integrated circuit packages 550A-B shown in FIG. 19 each includes a logic die 252B and an I/O die 252A that interfaces with the logic die 252B, though other combinations of integrated circuit dies 252 are possible. The integrated circuit packages 550 may be similar or may be different from each other, and more or fewer integrated circuit packages 550 may be present in other embodiments. Each integrated circuit package 550 may include an interposer 554 that provides electrical routing and connections between, for example, the integrated circuit dies 252 of that integrated circuit package 550. The interposer 554 may include metallization layers and/or conductive vias (not shown in FIG. 19). Each interposer 554 may also provide connection from an integrated circuit package 550 to the conductive connectors 512A-B.

The integrated circuit packages 550 may be placed such that conductive regions of the integrated circuit packages 550 (e.g., contact pads, conductive connectors, solder bumps, or the like, which may be part of the interposer 554) are aligned with corresponding conductive connectors 512A-B on the second redistribution structure 508. Once in physical contact, a reflow process may be utilized to bond the conductive connectors 512A-B to the integrated circuit packages 550, forming the package structure 500. An underfill 514 may be deposited between each integrated circuit package 550 and the second redistribution structure 508. The underfill 514 may also be deposited between the adjacent integrated circuit packages 550, as shown in FIG. 19. The underfill 514 may also at least partially surround the conductive connectors 512A-B. The underfill 514 may be a material such as a molding compound, an epoxy, an underfill, a molding underfill (MUF), a resin, or the like, and may be similar to underfill 224 described previously. Additionally, external connectors 216 and/or a supporting ring 220 may be formed in a manner similar to that described previously for FIG. 9.

Other features and processes may also be included in the various embodiments described herein. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and techniques disclosed herein may be used in conjunction with testing methodologies that incorporate intermediate verification of known good dies to increase the yield and decrease costs.

By utilizing the embodiments described herein, the performance of a device package may be improved, and the reliability of a device package may be improved. Different features of embodiments described herein may be combined to achieve these and other benefits. By using multiple interconnect structures within a package structure, the cost and assembly time of the package structure may be reduced. The interconnect structures may have conductive pillars, and one or more redistribution structures may be formed on the conductive pillars to make electrical connection to the interconnect structures. The techniques described herein allow for reduced warping in a package structure with multiple interconnect structures. Reducing the warping of the package structure can improve the joint strength, reliability, and performance of devices or packages attached to a redistribution structure of the package structure. In addition, the disclosed embodiments allows the formation of package structures having large areas (e.g., greater than about 100 mm by 100 mm, or the like) to be formed with a reduced risk of joint failure, especially joints that bond an integrated device package. This can allow multiple interconnect structures to be used within a package without increased warping, which can reduce the cost and processing time of a package. The techniques described herein are also applicable for bonding a variety of structures to form different types of packages. Additionally, using process techniques as described may result in improved yield and improved connection reliability, especially for packages having larger areas. For example, the process techniques described herein may reduce warpage and thus also reduce problems such as cracking or delamination associated with warping.

In some embodiments, a device includes a first interconnect structure, the first interconnect structure including conductive pillars on a first side of the first interconnect structure; a second interconnect structure, the second interconnect structure including conductive pillars on a first side of the second interconnect structure, wherein the second interconnect structure is laterally adjacent the first interconnect structure; an underfill material extending over the first side of the first interconnect structure, over the first side of the second interconnect structure, and extending between the first interconnect structure and the second interconnect structure; a first redistribution structure extending over the first side of the first interconnect structure and over the first side of the second interconnect structure, wherein the first redistribution structure is electrically connected to the conductive pillars of the first interconnect structure and to the conductive pillars of the second interconnect structure; and an integrated device package attached to the first redistribution structure. In an embodiment, the first interconnect structure includes a first core substrate, and wherein the second interconnect structure includes a second core substrate. In an embodiment, the first redistribution structure physically contacts the conductive pillars of the first interconnect structure and the conductive pillars of the second interconnect structure. In an embodiment, the device includes a second redistribution structure between the first redistribution structure and the first interconnect structure and between the first redistribution structure and the second interconnect structure, wherein the conductive features of the second redistribution structure have a larger size than the conductive features of the first redistribution structure. In an embodiment, the first redistribution structure includes first dielectric layers, the second redistribution structure includes second dielectric layers, and the first dielectric layers are a different material than the second dielectric layers. In an embodiment, the underfill material surrounds the conductive pillars of the first interconnect structure and the conductive pillars of the second interconnect structure. In an embodiment, surfaces of the conductive pillars of the first interconnect structure, surfaces of the conductive pillars of the second interconnect structure, and surfaces of the underfill material are level. In an embodiment, the conductive pillars are copper. In an embodiment, the conductive pillars of the first interconnect structure have a height in the range of 10 µm to 500 µm. In an embodiment, the conductive pillars of the first interconnect structure have a width in the range of 20 µm to 800 µm.

In some embodiments, a structure includes core substrates attached to a first side of a first redistribution structure, wherein the first redistribution structure includes first conductive features and first dielectric layers, wherein each core substrate includes conductive pillars, wherein the conductive pillars of the core substrates physically and electrically contact first conductive features; an encapsulant extending over the first side of the first redistribution structure, wherein the encapsulant extends along sidewalls of each core substrate; and an integrated device package connected to a second side of the first redistribution structure. In an embodiment, a sidewall of the encapsulant and a sidewall of the first redistribution structure are coplanar. In an embodiment, the first redistribution structure has dimensions of at least 100 mm by 100 mm. In an embodiment, the structure includes a second redistribution structure on the second side of the first redistribution structure, wherein the second redistribution structure includes second conductive features and second dielectric layers, wherein the second dielectric layers include a different dielectric material than the first dielectric layers, wherein the integrated device package is electrically connected to second conductive features. In an embodiment, the second conductive features have a linewidth that is less than or equal to 2 µm. In an embodiment, a sidewall of the second redistribution structure and a sidewall of the first redistribution structure are coplanar.

In some embodiments, a method includes attaching interconnect structures to a carrier, wherein each one of the interconnect structures includes conductive pillars; forming an encapsulant over the interconnect structures, wherein the encapsulant extends between adjacent ones of the interconnect structures; performing a planarization process on the encapsulant to expose the conductive pillars, wherein after performing the planarization process the encapsulant and the conductive pillars have coplanar surfaces; and forming first redistribution layers on the encapsulant and on the conductive pillars, wherein a bottom redistribution layer of the first redistribution layers is electrically connected to the conductive pillars. In an embodiment, the method includes forming second redistribution layers on the first redistribution layers, wherein the first redistribution layers are formed using a different technique than the second redistribution layers. In an embodiment, the second redistribution layers include polymer layers. In an embodiment, the method includes attaching integrated circuit dies to a top redistribution layer of the first redistribution layers.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    attaching interconnect structures to a carrier, wherein each one of the interconnect structures comprises conductive pillars, wherein the conductive pillars protrude from a top surface of the respective interconnect structure;
    forming an encapsulant over the interconnect structures, wherein the encapsulant extends between adjacent ones of the interconnect structures;
    performing a planarization process on the encapsulant to expose the conductive pillars, wherein after performing the planarization process the encapsulant and the conductive pillars have coplanar surfaces, wherein after performing the planarization process the encapsulant extends over the respective top surface of each interconnect structure;
    forming first redistribution layers on the encapsulant and on the conductive pillars, wherein a bottom first redistribution layer of the first redistribution layers is electrically connected to the conductive pillars; and
    bonding a semiconductor package to a top first redistribution layer of the first redistribution layers.

2. The method of claim 1, further comprising forming second redistribution layers on the first redistribution layers, wherein the first redistribution layers are formed using a different technique than the second redistribution layers.

3. The method of claim 2, wherein the second redistribution layers comprise polymer layers.

4. The method of claim 2, wherein the second redistribution layers have a smaller pitch than the first redistribution layers.

5. The method of claim 1, further comprising connecting integrated circuit dies to a top redistribution layer of the first redistribution layers.

6. The method of claim 1, wherein the semiconductor package comprises a plurality of semiconductor dies.

7. The method of claim 1, wherein the semiconductor package at least partially overlaps at least two interconnect structures.

8. The method of claim 1, wherein the conductive pillars of each interconnect structure protrude from the top surface of the respective interconnect structure a distance in the range of 10 µm to 500 µm.

9. A method comprising:
    placing a first interconnect structure on a carrier, wherein a first side of the first interconnect structure comprises first conductive pillars;
    placing a second interconnect structure on the carrier adjacent the first interconnect structure, wherein a first side of the second interconnect structure comprises second conductive pillars;
    depositing an underfill over and between the first interconnect structure and the second interconnect structure;
    forming a first redistribution structure on the underfill, wherein a first side of the first redistribution structure physically and electrically contacts at least one first conductive pillar of the first interconnect structure and at least one second conductive pillar of the second interconnect structure; and
    connecting a semiconductor die to the first redistribution structure, wherein the semiconductor die is on a second side of the first redistribution structure.

10. The method of claim 9, wherein the underfill covers the sidewalls of the first interconnect structure and the sidewalls of the second interconnect structure.

11. The method of claim 9, wherein a sidewall of the underfill is coplanar with a sidewall of the first redistribution structure.

12. The method of claim 9 further comprising forming a second redistribution structure on the first redistribution structure, wherein the first redistribution structure comprises first dielectric layers of a first dielectric material and the second redistribution structure comprises second dielectric layers of a second dielectric material that is different from the first dielectric material.

13. The method of claim 12, wherein the second dielectric layers are thinner than the first dielectric layers.

14. The method of claim 12 further comprising forming a third redistribution structure on the second redistribution structure, wherein the third redistribution structure comprises conductive lines that are thinner than the conductive lines of the second redistribution structure.

15. The method of claim 9 further comprising connecting a routing structure to the first redistribution structure using solder bumps.

16. A method comprising:
    forming a plurality of conductive pillars on a first interconnect structure, wherein the first interconnect structure comprises a plurality of routing layers, wherein each conductive pillar is formed on a topmost routing layer of the plurality of routing layers;
    depositing an encapsulant over the plurality of conductive pillars, on sidewalls of the first interconnect structure, and on sidewalls of the conductive pillars;
    planarizing the encapsulant to expose the plurality of conductive pillars;
    forming a first redistribution structure on the first interconnect structure, comprising:
        forming a first dielectric layer on the encapsulant and the plurality of conductive pillars;
        forming a plurality of vias penetrating the first dielectric layer, wherein each via physically contacts a respective conductive pillar; and
        forming a plurality of conductive lines on the first dielectric layer, wherein the plurality of conductive lines physically contact the plurality of vias; and
    bonding a die to the first redistribution structure, wherein the die extends over the encapsulant, wherein the first redistribution structure is between the die and the encapsulant.

17. The method of claim 16, wherein a width of the first dielectric layer is greater than a width of the first interconnect structure.

18. The method of claim 16, wherein the first redistribution structure is also formed on a second interconnect structure, wherein the first redistribution structure is electrically connected to the second interconnect structure.

19. The method of claim 18, wherein the first interconnect structure is separated from the second interconnect structure by the encapsulant.

20. The method of claim 9, wherein the first conductive pillars and the second conductive pillars have the same height.

* * * * *